US008804232B2

(12) United States Patent
Kim et al.

(10) Patent No.: US 8,804,232 B2
(45) Date of Patent: Aug. 12, 2014

(54) SEMICONDUCTOR OPTICAL DEVICES AND METHODS OF FABRICATING THE SAME

(75) Inventors: Dong Churl Kim, Daejeon (KR); Kisoo Kim, Daejeon (KR); Hyun Soo Kim, Daejeon (KR); Byung-seok Choi, Daejeon (KR); O-Kyun Kwon, Daejeon (KR); Jong Sool Jeong, Deajeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 427 days.

(21) Appl. No.: 13/307,067

(22) Filed: Nov. 30, 2011

(65) Prior Publication Data
US 2012/0281274 A1 Nov. 8, 2012

(30) Foreign Application Priority Data
May 4, 2011 (KR) ........................ 10-2011-0042251

(51) Int. Cl.
*H01S 5/10* (2006.01)
(52) U.S. Cl.
CPC ............... *H01S 5/1014* (2013.01); *H01S 5/101* (2013.01); *H01S 5/1003* (2013.01); *H01S 5/1028* (2013.01)
USPC ...................................................... 359/344
(58) Field of Classification Search
CPC ..... H01S 5/1028; H01S 5/101; H01S 5/1014; H01S 5/1003
USPC ...................................................... 359/344
See application file for complete search history.

(56) References Cited

U.S. PATENT DOCUMENTS

| 5,978,400 | A * | 11/1999 | Campbell et al. ........... 372/46.01 |
| 6,973,241 | B2 * | 12/2005 | Kelly et al. .................... 385/50 |
| 7,010,183 | B2 * | 3/2006 | Estes et al. .................... 385/14 |
| 7,058,248 | B2 * | 6/2006 | Grubb et al. ................... 385/14 |
| 7,190,852 | B2 * | 3/2007 | Heim et al. .................... 385/14 |
| 7,288,794 | B2 * | 10/2007 | Marsh et al. .................. 257/80 |
| 7,324,719 | B2 * | 1/2008 | Kish et al. ..................... 385/14 |

(Continued)

FOREIGN PATENT DOCUMENTS

KR         10-0785775         12/2007

OTHER PUBLICATIONS

K. Asaka et al., "Lossless Electroabsorption Modulator Monolithically integrated with a Semiconductor Optical Amplifier and a Passive Waveguide", IEEE Photonics Technology Letters, vol. 15, No. 5, pp. 679-681, May 2003.

*Primary Examiner* — Mark Hellner
*Assistant Examiner* — Ari M Diacou
(74) *Attorney, Agent, or Firm* — Rabin & Berdo, P.C.

(57) ABSTRACT

A semiconductor optical device includes a first mode converting core, a light amplification core, a second mode converting core, and a light modulation core disposed in a first mode converting region, a light amplification region, a second mode converting region, and a light modulating region of a semiconductor substrate, respectively, and a current blocking section covering at least sidewalls and a top surface of the light amplification core. The first mode converting core, the light amplification core, the second mode converting core, and the light modulation core are arranged along one direction in the order named, and are connected to each other in butt joints. The current blocking section includes first, second, and third cladding patterns sequentially stacked. The second cladding pattern is doped with dopants of a first conductivity type, and the first and third cladding patterns are doped with dopants of a second conductivity type.

19 Claims, 23 Drawing Sheets

(56) References Cited

U.S. PATENT DOCUMENTS

| | | | |
|---|---|---|---|
| 7,333,691 B1* | 2/2008 | Gill et al. | 385/32 |
| 7,437,029 B2* | 10/2008 | Joyner et al. | 385/14 |
| 7,474,682 B2* | 1/2009 | Mizuuchi et al. | 372/46.01 |
| 7,539,378 B2* | 5/2009 | Takabayashi et al. | 385/40 |
| 7,551,826 B2* | 6/2009 | Taylor | 385/129 |
| 7,688,870 B2* | 3/2010 | Oh et al. | 372/1 |
| 7,738,167 B2* | 6/2010 | Kim et al. | 359/344 |
| 8,149,503 B2* | 4/2012 | Kim et al. | 359/344 |
| 8,363,314 B2* | 1/2013 | Oh et al. | 359/344 |
| 8,472,109 B2* | 6/2013 | Tanaka et al. | 359/344 |
| 2003/0141511 A1* | 7/2003 | Marsh et al. | 257/98 |
| 2005/0207696 A1* | 9/2005 | Welch et al. | 385/14 |
| 2005/0220403 A1* | 10/2005 | Dykaar | 385/31 |
| 2006/0159133 A1* | 7/2006 | Hwang et al. | 372/19 |
| 2006/0228067 A1* | 10/2006 | Joyner et al. | 385/14 |
| 2006/0274802 A1* | 12/2006 | Aoki et al. | 372/45.01 |
| 2007/0030866 A1* | 2/2007 | Kim et al. | 372/19 |
| 2007/0165685 A1* | 7/2007 | Mizuuchi et al. | 372/38.05 |
| 2008/0137178 A1* | 6/2008 | Chung et al. | 359/321 |
| 2008/0137180 A1* | 6/2008 | Oh et al. | 359/344 |
| 2009/0003399 A1* | 1/2009 | Taylor | 372/50.1 |
| 2009/0022194 A1* | 1/2009 | Watanabe et al. | 372/45.01 |
| 2009/0116522 A1* | 5/2009 | Watson et al. | 372/38.01 |
| 2009/0154514 A1* | 6/2009 | Oh et al. | 372/45.011 |
| 2009/0225801 A1* | 9/2009 | Mori et al. | 372/29.011 |
| 2010/0034223 A1* | 2/2010 | Osinski et al. | 372/18 |
| 2010/0209108 A1* | 8/2010 | Kim et al. | 398/67 |
| 2011/0243494 A1* | 10/2011 | Hasegawa et al. | 385/14 |
| 2012/0307857 A1* | 12/2012 | Oh et al. | 372/46.01 |
| 2013/0163993 A1* | 6/2013 | Choi et al. | 398/79 |

\* cited by examiner

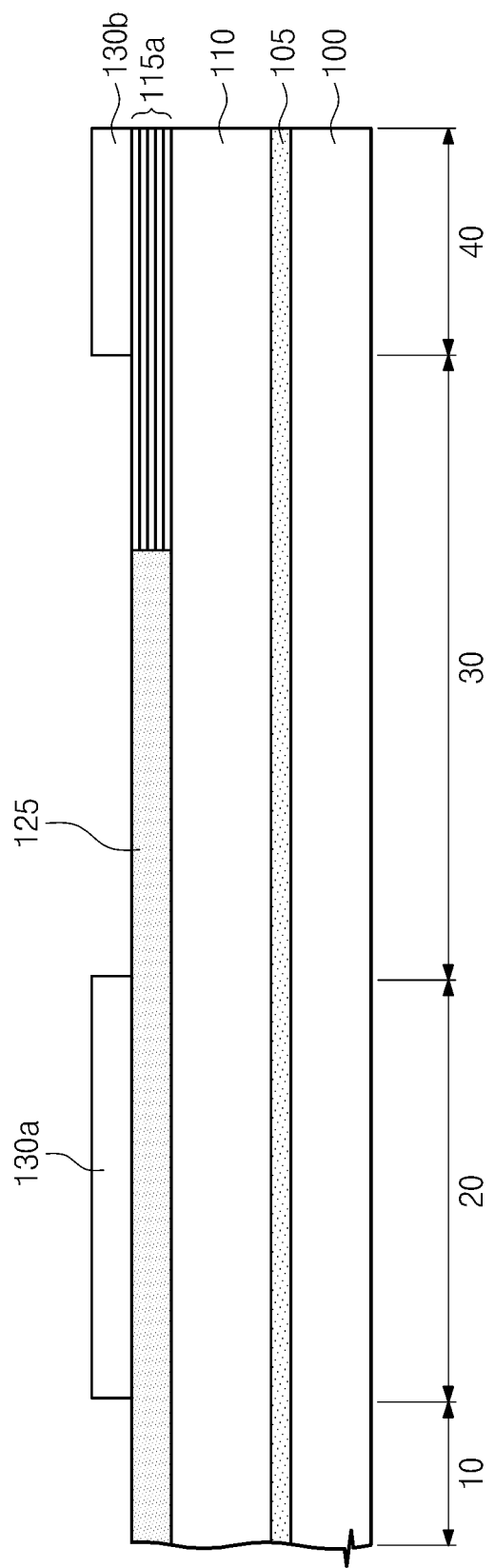

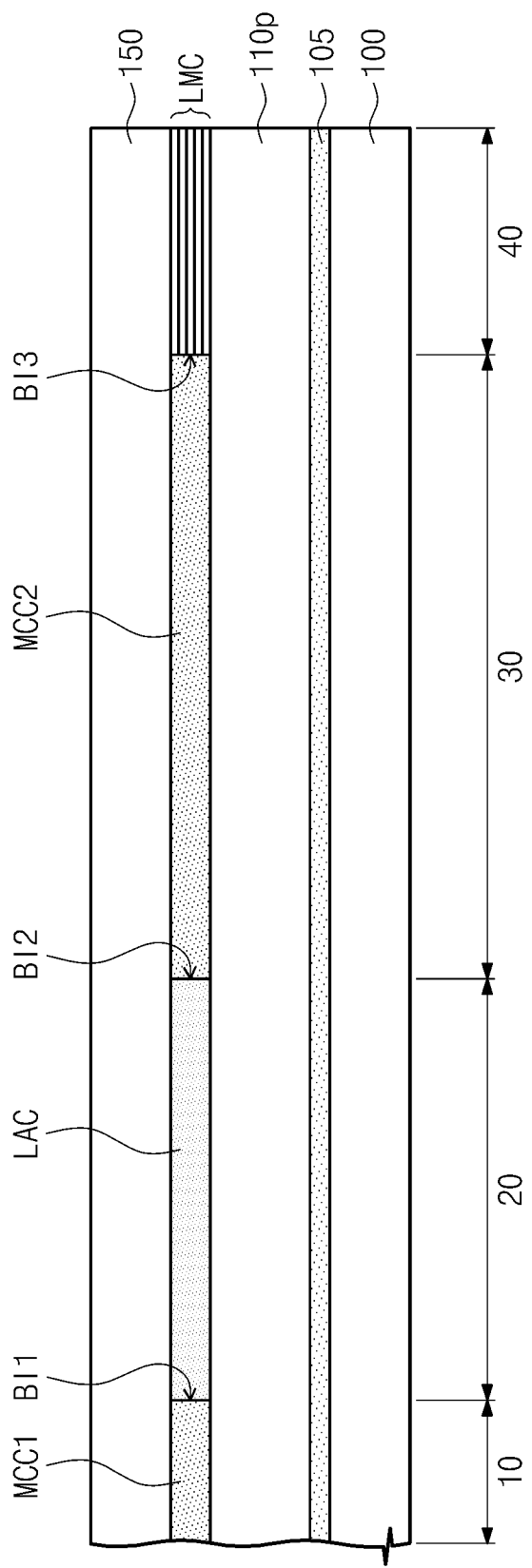

SEMICONDUCTOR OPTICAL DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0042251, filed on May 4, 2011, the entirety of which is incorporated by reference herein.

BACKGROUND

The present disclosure herein relates to an optical device and a method of fabricating the same and, more particularly, to semiconductor optical device with hetero integration and methods of fabricating the same.

Optical communication using an optical signal may less interfere with an external electromagnetic wave and may process more data than electrical communication. Thus, the optical communication is very attractive in an electronic industry requiring high communication speed and/or more communication traffic.

In the optical communication, the optical signal may be demanded to be treated by various methods. For example, the optical signal for the optical communication may be amplified and/or modulated. For the various treatments of the optical signal, optical devices (e.g. an optical amplifier and/or an optical modulator, etc) have been developed.

Optical devices having small size, low fabricating cost, and/or multi-function characteristics have been demanded with the development of the electronic industry. To satisfy the above various characteristics, semiconductor optical devices have been developed. The semiconductor optical devices may correspond to optical devices to which fabricating technique based on semiconductor is applied. Recently, the semiconductor optical devices have been actively developed.

SUMMARY

Embodiments of the inventive concept may provide semiconductor optical device with high integration and methods of fabricating the same.

Embodiments of the inventive concept may also provide semiconductor optical device capable of performing multi-function and methods of fabricating the same.

Embodiments of the inventive concept may also provide semiconductor optical device with high performance functions and methods of fabricating the same.

According to embodiments of the inventive concepts, a semiconductor optical device may include: a first mode converting core, a light amplification core, a second mode converting core, and a light modulation core disposed in a first mode converting region, a light amplification region, a second mode converting region, and a light modulating region of a semiconductor substrate, respectively; and a current blocking section covering at least sidewalls and a top surface of the light amplification core. The first mode converting core, the light amplification core, the second mode converting core, and the light modulation core are arranged along one direction in the order named, and are connected to each other in butt joints. The current blocking section includes first, second, and third cladding patterns sequentially stacked, the second cladding pattern is doped with dopants of a first conductivity type, and the first and third cladding patterns are doped with dopants of a second conductivity type.

In some embodiments, the dopants of the first conductivity type may be N-type dopants and the dopants of the second conductivity type may be P-type dopants.

In other embodiments, the first cladding pattern and the second cladding pattern may cover the sidewalls of the light amplification core, and the third cladding pattern may cover the second cladding pattern and the top surface of the light amplification core.

In still other embodiments, the semiconductor optical device may further include: a sub-core disposed on the semiconductor substrate; and a base cladding pattern disposed on the sub-core. The first mode converting core, the light amplification core, the second mode converting core, and the light modulation core may be disposed on the base cladding pattern.

In yet other embodiments, the first, second, and third cladding patterns may extend into the first mode converting region to cover sidewalls of a top surface of the first mode converting core. The first, second, and third cladding patterns may further extend to pass an end of the first mode converting core, thereby forming an input/output waveguide.

In yet still other embodiments, the first mode converting core may include a tapered portion and a uniform portion. The uniform portion may be connected to the light amplification in the butt joint. The uniform portion may be disposed between the tapered portion and the light amplification core.

In further embodiments, the tapered portion may extend in a direction being non-parallel to and non-perpendicular to the one direction when viewed from a plan view.

In still further embodiments, the first mode converting core, the light amplification core, and the second mode converting core may be formed of semiconductor materials different from the semiconductor substrate.

In even further embodiments, the light amplification core may be formed of a first semiconductor material and the first and second mode converting cores may be formed of a second semiconductor material. An energy band gap of the first semiconductor material may be different form an energy band gap of the second semiconductor material. The light modulation core may be formed of a different material from the first and second semiconductor materials.

In yet further embodiments, the third cladding pattern may extend into the second mode converting region and the light modulating region to cover a top surface of the second mode converting core and a top surface of the light modulation core. The first and second cladding patterns may extend into the second mode converting region to cover portions of sidewalls of the second mode converting core.

In yet further embodiments, the second mode converting core may include a buried core portion and a deep-ridge core portion. the buried core portion may include a buried straight portion connected to the light amplification core in the butt joint, and a buried widening portion disposed between the buried straight portion and the deep-ridge core portion. The deep-ridge core portion may include a deep-ridge straight portion connected to the light modulation core in the butt joint, and a deep-ridge narrowing portion disposed between the deep-ridge straight portion and the buried widening portion. A width of the buried widening portion may become progressively greater toward the light modulation core from the light amplification core. A width of the deep-ridge narrowing portion may become progressively less toward the light modulation core form the light amplification core.

In yet further embodiments, the semiconductor optical device may further include at least one insulating region formed in at least the third cladding pattern. The insulating region may electrically insulate a light amplifier including the light amplification core from a light modulator including the light modulation core.

In yet further embodiments, the first mod converting core may be connected to the light amplification core in the butt joint to define a first butt interface, the light amplification core may be connected to the second mode converting core in the butt joint to define a second butt interface, and the second mode converting core may be connected to the light modulation core in the butt joint to define a third butt interface. The first, second, and third butt interfaces may be non-parallel to and non-perpendicular to the one direction when viewed from a plan view.

In yet further embodiments, the semiconductor optical device may further include a polyimide pattern disposed in the light modulating region and protecting a light modulator including the light modulation core.

In yet further embodiments, the semiconductor optical device may further include: a back side electrode formed on a back side of the semiconductor substrate; a light amplification electrode disposed over the light amplification core; and a light modulation electrode disposed over the light modulation core.

According to embodiments of the inventive concepts, a method of fabricating a semiconductor optical device may include: forming a light modulation core layer on a semiconductor substrate including a first mode converting region, a light amplification region, a second mode converting region, and a light modulating region; selectively removing the light modulation core layer to form a first removed region and a first residual pattern, the first residual pattern formed in a portion of the light modulating region and a portion of the second mode converting region; forming a first semiconductor layer in the first removed region; selectively removing the first semiconductor layer and the first residual pattern to form a second removed region, a first semiconductor pattern in the light amplification region, and a second residual pattern in the light modulating region; forming a second semiconductor layer in the second removed region, the second semiconductor layer being in contact with sidewalls of the first semiconductor pattern and sidewalls of the second residual pattern; and patterning at least the second semiconductor layer in the first mode converting region and the first semiconductor pattern in the light amplification region to form a first mode converting core and a light amplification core. An energy band gap of the first semiconductor layer is different from an energy band gap of the second semiconductor layer.

In some embodiments, the method may further include patterning the second semiconductor layer in the second mode converting region to form a preliminary second mode converting core. The preliminary second mode converting core, the first mode converting core, and the light amplification core may be formed simultaneously.

In other embodiments, the method may further include: sequentially forming a first cladding layer and a second cladding layer on the semiconductor substrate including the first mode converting core, the light amplification core, and the preliminary second mode converting core; planarizing the second and first cladding layers to expose the first mode converting core, the light amplification core, and the preliminary second mode converting core; forming a third cladding layer on the semiconductor substrate; and patterning the third cladding layer, the planarized second and first cladding layers, the preliminary second mode converting core, and the second residual pattern in the light modulating region to form a first mode convertor, a light amplification waveguide, a second mode convertor, and a light modulation waveguide in the first mode converting region, the light amplification region, the second mode converting region, and the light modulating region, respectively.

In still other embodiments, the method may further include sequentially forming a sub-core layer and a base cladding layer on the semiconductor layer before forming the light modulation core layer.

BRIEF DESCRIPTION OF THE DRAWINGS

The inventive concept will become more apparent in view of the attached drawings and accompanying detailed description.

FIGS. 12A through 16A are plan views illustrating a method of fabricating a semiconductor optical device according to an exemplary embodiment of the inventive concept;

FIGS. 12B through 16B are cross-sectional views taken along lines I-I' of FIGS. 12A through 16A, respectively;

FIGS. 12C through 16C are cross-sectional views taken along lines II-II' of FIGS. 12A through 16A, respectively;

FIGS. 12D through 16D are cross-sectional views taken along lines III-III' of FIGS. 12A through 16A, respectively;

DETAILED DESCRIPTION OF THE EMBODIMENTS

Figure 1:
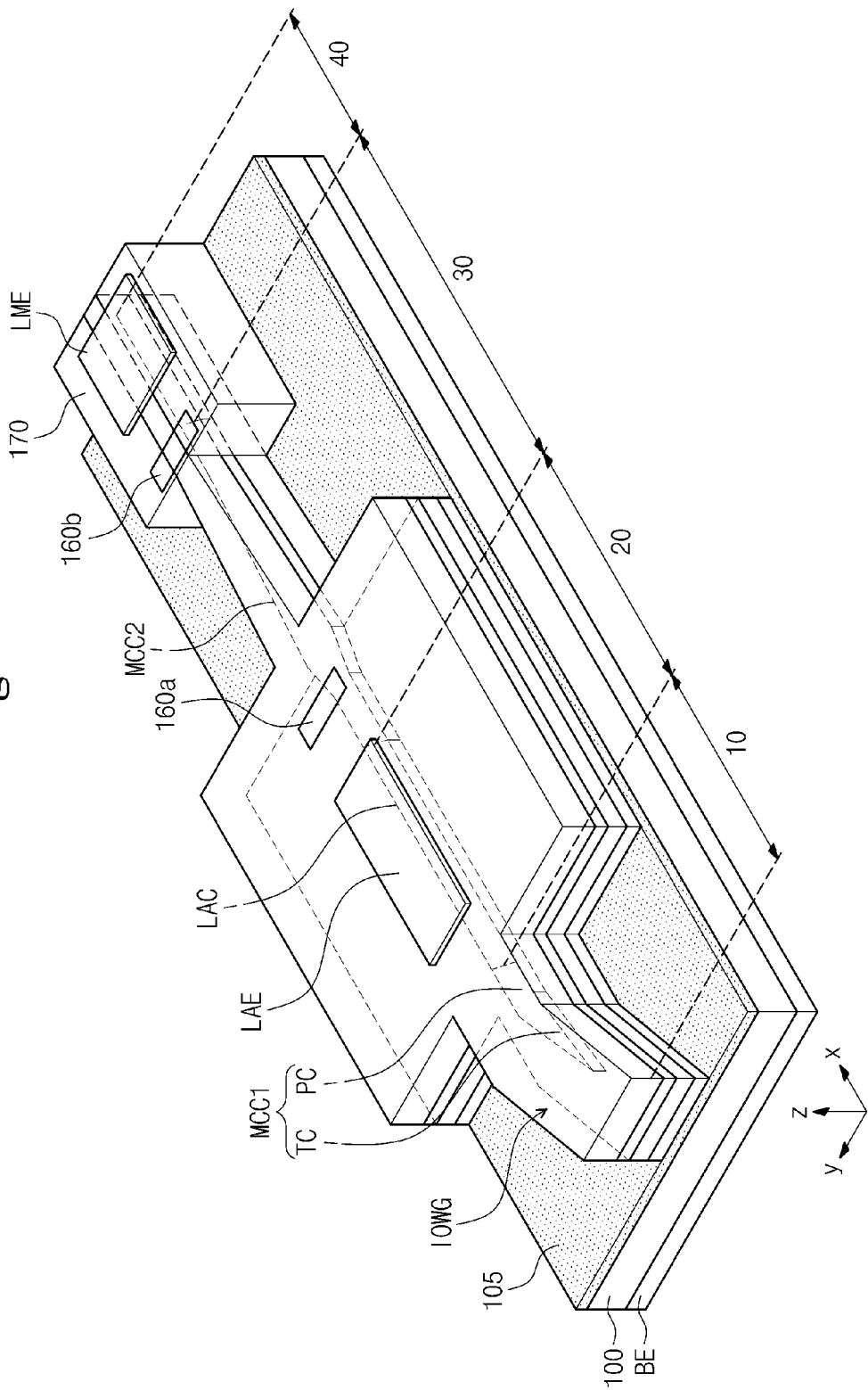
FIG. 1 is a perspective view illustrating a semiconductor optical device according to an exemplary embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
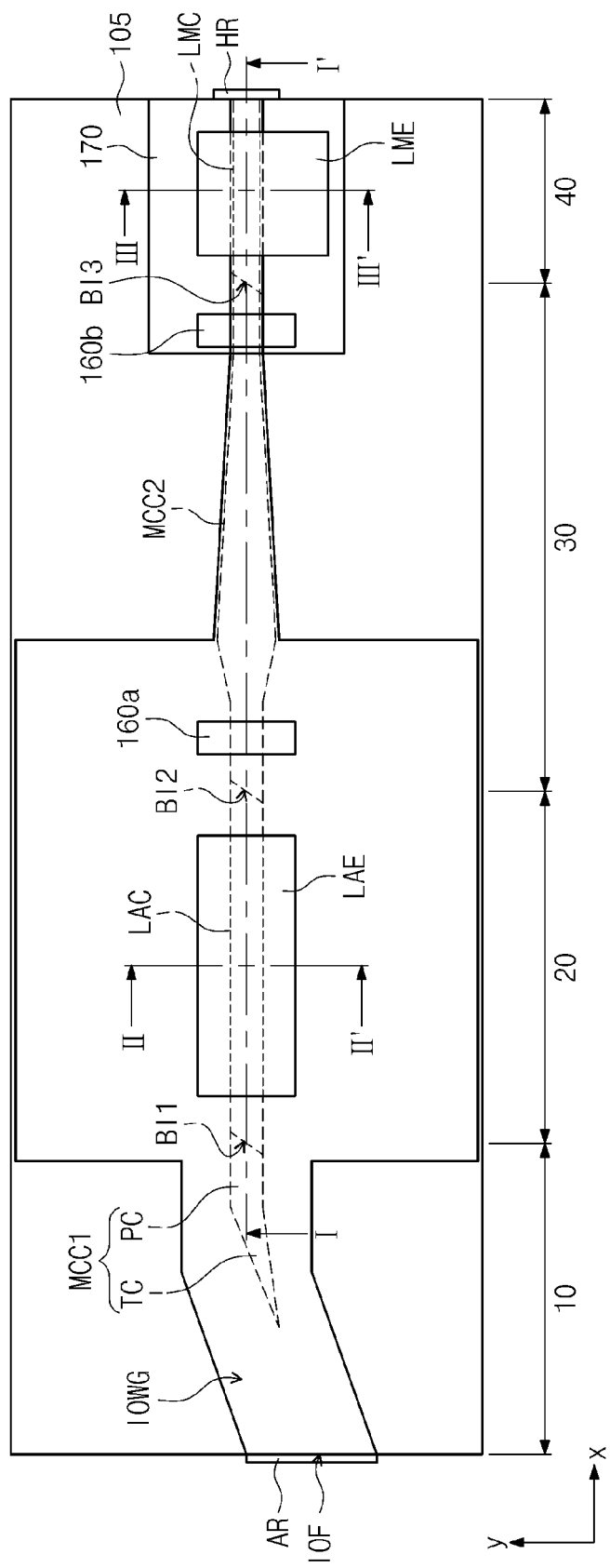
FIG. 2 is a plan view illustrating the semiconductor optical device of the FIG. 1.
Figure 3:
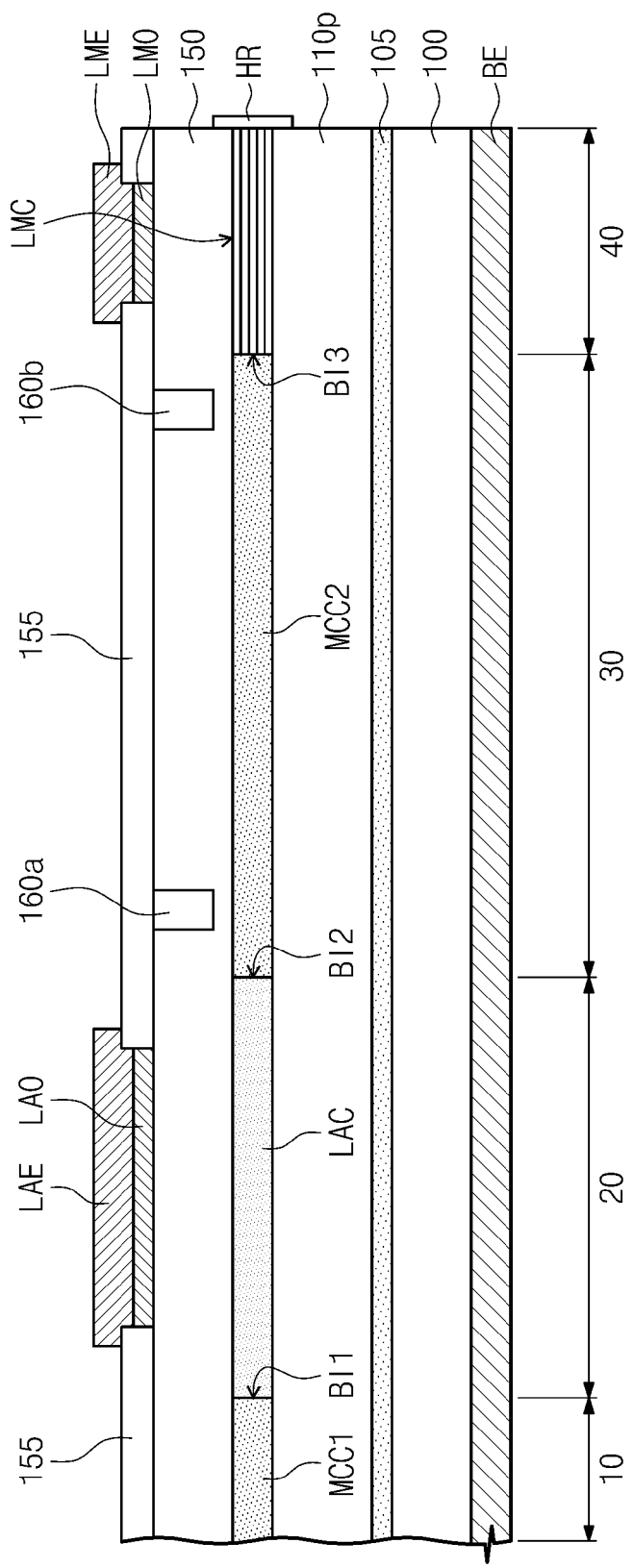
FIG. 3 is a cross-sectional view taken along a line I-I' of FIG. 2.
Figure 4:
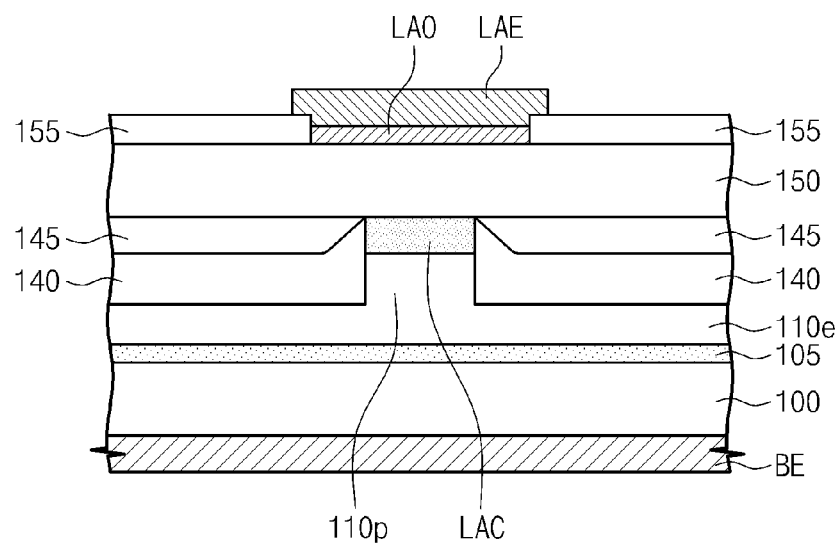
FIG. 4 is an enlarged cross-sectional view taken along a line II-II' of FIG. 2.
Figure 5:
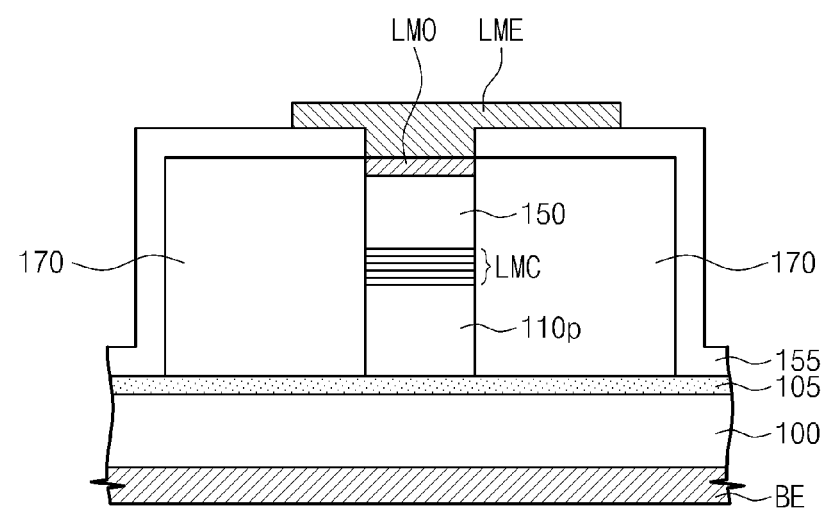
FIG. 5 is an enlarged cross-sectional view taken along a line III-III' of FIG. 2.

FIG. 1 is a perspective view illustrating a semiconductor optical device according to an exemplary embodiment of the inventive concept, and FIG. 2 is a plan view illustrating the semiconductor optical device of the FIG. 1. FIG. 3 is a cross-sectional view taken along a line I-I' of FIG. 2, FIG. 4 is an enlarged cross-sectional view taken along a line II-II' of FIG. 2, and FIG. 5 is an enlarged cross-sectional view taken along a line III-III' of FIG. 2.

Referring to FIGS. 1 through 5, a semiconductor optical device according to an embodiment of the inventive concept may include a semiconductor substrate 100. The semiconductor substrate 100 may include a first mode converting region 10, a light amplification region 20, a second mode converting region 30, and a light modulating region 40. The first mode converting region 10 may be disposed at a side of the light amplification region 20, and the second mode converting region 30 may be disposed between the light amplification region 20 and the light modulating region 40. In other words, the first mode converting region 10, the light amplification region 20, a second mode converting region 30, and the light modulating region 40 may be arranged in one direction in the order named when viewed from a plan view. The one direction may correspond to an x-axis of FIG. 2. A first mode convertor may be disposed in the first mode converting region 10, and a light amplifier may be disposed in the light amplification region 20. A second mode convertor may be disposed in the second mode converting region 30, and a light modulator may be disposed in the light modulating region 40.

A sub-core 105 may be disposed on the semiconductor substrate 100. The sub-core 105 may be continuously disposed in the first mode converting region 10, the light amplification region 20, the second mode converting region 30, and the light modulating region 40 without a break. The sub-core 105 may be included in a sub-waveguide. The semiconductor substrate 100 may cover a bottom surface of the sub-core 105. The semiconductor substrate 100 may correspond to a lower cladding layer of the sub-waveguide. The semiconductor substrate 100 may be formed of a semiconductor material. For example, the semiconductor substrate 100 may be formed of a compound semiconductor. In some embodiments, the semiconductor substrate 100 may be formed of a compound semiconductor doped with dopants of a first conductivity type. For example, the semiconductor substrate 100 may be formed of indium-phosphorus (InP) doped with dopants of the first conductivity type. The sub-core 105 may include a four-elements-compound semiconductor having a first energy band gap. For example, the sub-core 105 may be formed of indium-gallium-arsenic-phosphorus (InGaAsP) having the first energy band gap.

A first mode converting core MCC1 may be disposed over the sub-core 105 in the first mode converting region 10. A light amplification core LAC may be disposed over the sub-core 105 in the light amplification region 20. A second mode converting core MCC2 may be disposed over the sub-core 105 in the second mode converting region 30. A light modulation core LMC may be disposed over the sub-core 105 in the light modulating region 40. The first mode converting core MCC1, the light amplification core LAC, the second converting core MCC2, and the light modulation core LMC may be arranged along the one direction in the order named when viewed in a plan view. Additionally, the first mode converting core MCC1, the light amplification core LAC, the second converting core MCC2, and the light modulation core LMC may be connected to each other in butt joints. A longitudinal direction of each of at least the light amplification core LAC, the second converting core MCC2, and the light modulation core LMC may be parallel to the one direction. A first butt interface BI1 is defined in the butt joint between the first mode converting core MCC1 and the light amplification core LAC. A second butt interface BI2 is defined in the butt joint between the light amplification core LAC and the second mode converting core MCC2. A third butt interface BI3 is defined in the butt joint between the second mode converting core MCC2 and the light modulation core LMC.

The first mode converting core MCC1 may be formed of a compound semiconductor having a second energy band gap. For example, the first mode converting core MCC1 may include a four-elements-compound semiconductor having the second energy band gap. The light amplification core LAC may be formed of a compound semiconductor having a third energy band gap. For example, the light amplification core LAC may be formed of a four-elements-compound semiconductor having the third energy band gap. The second energy band gap of the first mode converting core MCC1 may be different from the third energy band gap of the light amplification core LAC. In some embodiments, the first energy band gap of the sub-core 105 may be different from the second and third energy band gaps of the first mode converting and light amplification cores MCC1 and LAC.

An optical signal may be incident on the semiconductor optical device. The optical signal may be the light including signal. A wavelength of the optical signal incident on the semiconductor optical device may be converted into energy. The other way, the energy may be converted into the wavelength. For example, the wavelength of 1.55 μm may be converted into the energy of about 0.8 eV (electron volt). Hereinafter, the energy band gap may be converted into the wavelength to be used in explanation, and/or the energy band gap mixed with the wavelength may be used in explanation. In some embodiments, the second energy band gap of the first mode converting core MCC1 may be less than the wavelength of the optical signal incident on the semiconductor optical device. For example, if the wavelength of the incident optical signal is 1.55 μm, the second energy band gap of the first mode converting core MCC1 may be about 1.24 μm. However, the inventive concept is not limited thereto.

In some embodiments, the third energy band gap of the light amplification core LAC may be greater than the second energy band gap of the first mode converting core MCC1. In some embodiments, the third energy band gap of the light amplification core LAC may be substantially the same as the wavelength of the incident optical signal. For example, if the wavelength of the incident optical signal is 1.55 μm, the third energy band gap of the light amplification core LAC may be about 1.55 μm. However, the inventive concept is not limited thereto.

In some embodiments, the first energy band gap of the sub-core 105 may be less than the second energy band gap of the first mode converting core MCC1. For example, the first energy band gap of the sub-core 105 may be about 1.1 μm. However, the inventive concept is not limited thereto.

In some embodiments, the sub-core 105 may be formed of InGaAsP having the first energy band gap. The first mode converting core MCC1 may be formed of InGaAsP having the second energy band gap. The light amplification core LAC may be formed of InGaAsP having the third energy band gap. A content ratio of elements of the InGaAsP may be controlled, so that the energy band gap of the InGaAsP may be controlled.

In some embodiments, the second mode converting core MCC2 may be formed of a compound semiconductor having an energy band gap less than the wavelength of the incident optical signal. For example, the second mode converting core MCC2 may include the same compound semiconductor as the first mode converting core MCC1.

The light modulation core LMC may be formed to have a multiple quantum well structure causing quantum electroabsorption. For example, the light modulation core LMC may include first layers and second layers. Each of the first layers has a different energy band gap from that of each of the second layers. The first layers and second layers may be alternately stacked. The first layers may correspond to wells of the multiple quantum well structure, and the second layers may be used as barriers of the multiple quantum well structure. For example, each of the first layers may be formed of InGaAsP used as the well, and each of the second layers may be formed of InGaAsP used as the barrier.

A bass cladding pattern 110p may be disposed between the first mode converting core MCC1 and the sub-core 105, between the light amplification core LAC and the sub-core 105, between the second mode converting core MCC2 and the sub-core 105, and between the light modulation core LMC and the sub-core 105. The base cladding pattern 110p may correspond to an upper cladding layer of the sub-waveguide. Additionally, the base cladding pattern 110p may be include in claddings of waveguides including the first mode converting, the light amplification, the second mode converting, and the light modulation cores MCC1, LAC, MCC2, and LMC. The waveguides including the cores MCC1, LAC, MCC2, and LMC will be described later. The base cladding pattern 110p may be formed of a compound semiconductor. In some embodiments, the base cladding pattern 110p may be doped with dopants of the first conductivity type. For example, the base cladding pattern 110p may be formed of InP doped with dopants of the first conductivity type.

As illustrated in FIGS. 1, 2, and 4, first, second and third cladding patterns 140, 145, and 150 may cover at least a sidewall and a top surface of the light amplification core LAC. The first and second cladding patterns 140 and 145 may cover the sidewall of the light amplification core LAC. The first and second cladding pattern 140 and 145 may be sequentially stacked on the sub-core 105 at both sides of the light amplification core LAC. The third cladding pattern 150 may be disposed on the top surface of the light amplification core LAC. Additionally, the third cladding pattern 150 may laterally extend to be disposed on the second cladding pattern 145.

Each of the first, second, and third cladding patterns 140, 145, and 150 may be formed of a compound semiconductor. The first cladding pattern 140 may be formed of a compound semiconductor doped with dopants of a second conductivity type, and the second cladding pattern 145 may be formed of a compound semiconductor doped with dopants of the first conductivity type. The third cladding pattern 150 may be formed of a compound semiconductor doped with dopants of the second conductivity type. For example, the first cladding pattern 140 may include InP of the second conductivity type, the second cladding pattern 145 may include InP of the first conductivity type, and the third cladding pattern 150 may include InP of the second conductivity type.

The dopants of the first conductivity type may be N-type dopants, and the dopants of the second conductivity type may be P-type dopants. For example, the first cladding pattern 140 may include P-type InP, the second cladding pattern 145 may include N-type InP, and the third cladding pattern 150 may include P-type InP. In this case, the cladding patterns 140, 145, and 150 of a PNP structure may be disposed at both sides of the light amplification core LAC.

A lower portion of the base cladding pattern 110p may laterally extend. In this case, the extension 110e of the base cladding pattern 110p may be disposed between the first cladding pattern 140 and the sub-core pattern 105. A top surface of the extension 110e of the base cladding pattern 110p may be disposed at a lower level than an topmost surface of the base cladding pattern 110p under bottom surfaces of the cores MCC1, LAC, MCC2, and LMC.

Again referring to FIGS. 1 through 5, the third cladding pattern 150 in the light amplification region 20 may extend into the first mode converting region 10, the second converting region 30, and the light modulating region 40. Thus, the third cladding pattern 150 may also be disposed on top surfaces of the first mode converting core MCC1, the second mode converting core MCC2, and the light modulation core LMC.

The first and second cladding pattern 140 and 145 in the light amplification region 20 may laterally extend into the first mode converting region 10 to cover sidewalls of the first mode converting core MCC1. Additionally, the first, second, and the third cladding patterns 140, 145, and 150 may further extend in the first mode converting region 10 to realize an input/output waveguide IOWG illustrated in FIG. 1. The input/output waveguide IOWG will be described in more detail later.

The first and second cladding patterns 140 and 145 in the light amplification region 20 may laterally extend into the second converting region 30. Thus, the first and second cladding patterns 140 and 145 in the second converting region 30 may cover sidewalls of a portion of the second mode converting core MCC2. In some embodiments, sidewalls of another portion of the second mode converting core MCC2 may not be covered by the first and second cladding patterns 140 and 145. The extension 110e of the base cladding pattern 110p in the light amplification region 20 may extend into the second mode converting region 30 to be disposed between the first cladding pattern 140 and the sub-core 105 in the second mode converting region 30.

As illustrated in FIGS. 1 through 4, a light amplification electrode LAE may be disposed over the third cladding pattern 150 in the light amplification region 20. The light amplification electrode LAE may be electrically connected to the third cladding pattern 150 disposed on the top surface of the light amplification core LAC. In some embodiments, a light amplification ohmic pattern LAO may be disposed between the light amplification electrode LAE and the third cladding pattern 150. For example, the light amplification ohmic pattern LAO may be formed of indium-gallium-arsenic (InGaAs). The third cladding pattern 150 in the light amplification region 20 may include a first top surface contacting the light amplification ohmic pattern LAO and a second top surface not contacting the light amplification ohmic pattern LAO. A capping dielectric pattern 155 may be disposed on the second top surface of the third cladding pattern 150 in the light amplification region 20. Additionally, the capping dielectric pattern 155 may cover portions of the first mode convertor, the light amplifier, the second mode convertor, and the light modulator which may be exposed by air. At least the second top surface of the third cladding pattern 150 may be protected by the capping dielectric pattern 155. For example, the capping dielectric pattern 155 may be formed of silicon nitride.

A back side electrode BE may be disposed on a back side of the semiconductor substrate 100. The back side electrode BE may be electrically connected to the semiconductor substrate 100. In some embodiments, the back side electrode BE may cover the entire back side of the semiconductor substrate 100.

The light amplifier in the light amplification region 20 may include a light amplification waveguide, the light amplification electrode LAE controlling the light amplification waveguide, and the back side electrode BE. The light amplification waveguide may include the light amplification core LAC and the base, first, second, and third cladding patterns 110p, 140, 145, and 150 surrounding the light amplification core LAC. The light amplification core LAC may be completely surrounded by the cladding patterns 110p, 140, 145, and 150. Thus, the light amplification waveguide including the light amplification core LAC may have a planar-buried hetero structure. In some embodiments, a forward current may be provided between the light amplification electrode LAE and the back side electrode BE to generate population inversion. Thus, the light signal provided in the light amplification core LAC can be amplified.

The first, second, and third cladding patterns 140, 145, and 150 surrounding the light amplification core LAC may be included in a current blocking section. As described above, the first, second, and third cladding patterns 140, 145, and 150 may have the PNP structure. In other words, the current blocking section may have the PNP structure. Thus, the current blocking section may have high resistance. As a result, the current blocking section can minimize a leakage of the forward current for amplifying the optical signal. Since the leakage of the forward current can be minimized by the current blocking section, it is possible to increase amplification efficiency of the optical signal by the forward current. Additionally, since the current blocking section may be realized by the first, second, and third cladding patterns 140, 145, and 150, fabrication yield of the semiconductor optical device may be improved. In some embodiments, a width of the light amplification core LAC may be about 1 μm, and a thickness of the light amplification core LAC may be about 0.3 μm. A length of the light amplification core LAC may be about 400 μm. However, the inventive concept is not limited thereto.

As illustrated in FIGS. 1, 2, 3, and 5, both sidewalls of the light modulation core LMC may not be covered by the first and second cladding patterns 140 and 145. The third cladding pattern 150 disposed on the top surface of the light modulation core LMC may have both sidewalls being self-aligned with the both sidewalls of the light modulation core LMC. A light modulation electrode LME may be disposed on the third cladding pattern 150 located on the light modulation core LMC. The light modulation electrode LME may be electrically connected to the third cladding pattern 150 on the light modulation core LMC. In some embodiments, a light modulation ohmic pattern LMO may be disposed between the light modulation core LMC and the third cladding pattern 150. For example, the light modulation ohmic pattern LMO may be formed of InGaAs. The light modulation electrode LME may be overlapped with the back side electrode BE located on the back side of the semiconductor substrate 100 in the light modulating region 40.

In some embodiments, a polyimide pattern 170 may be disposed at both sides of the light modulation core LMC. The polyimide pattern 170 is formed of polyimide. The polyimide pattern 170 may cover both sidewalls of the base cladding pattern 110p and the third cladding pattern 150 respectively disposed under and on the light modulation core LMC.

The light modulator in the light modulation region 40 may include a light modulation waveguide, the light modulation electrode LME, and the back side electrode BE overlapped with the light modulation electrode LME. The light modulation waveguide may include the light modulation core LME, the base cladding pattern 110p under the light modulation core LME, and the third cladding pattern 150 on the light modulation core LME. As described above, the both sidewalls of the light modulation core LME may not be covered by the first and second cladding patterns 140 and 145. Accordingly, the light modulation waveguide may have a deep-ridge structure. The light modulation waveguide having the deep-ridge structure may be protected from humidity and/or oxidation by the polyimide pattern 170. Additionally, a portion of the light modulation waveguide, which is not covered by the polyimide pattern 170, may be protected from humidity and/or oxidation by the capping dielectric pattern 155.

When the light modulator is operated, a reverse bias may be applied to the light modulation waveguide through the light modulation electrode LME and the back side electrode BE. In this case, a quantum confinement Stark effect may occur in the light modulation core LMC having the multiple quantum well structure. Thus, the quantum electroabsorption effect may occur to modulate the optical signal in the light modulation core LMC. For example, if the reverse bias between the light modulation electrode LME and the back side electrode BE is provided through a radio frequency (RF) signal, a shape of the RF signal may be projected on the optical signal passing through the light modulation core LMC. Thus, the optical signal may be modulated to the same shape as the RF signal. For example, a width of the light modulation core LMC may be about 2 μm, and a length of the light modulation core LMC may be about 70 μm. However, the inventive concept is not limited thereto.

A high reflection coating film HR may be formed on an end of the light modulation core LMC opposite to the third butt interface BI3. That is, the light modulation core LMC may be disposed between the second mode converting core MCC2 and the high reflection coating film HR.

As illustrated in FIGS. 1 through 3, at least one insulating region 160a and 160b may be disposed in at least the third cladding pattern 150 between the light amplification electrode LAE and the light modulation electrode LME. In some embodiments, a first insulating region 160a and a second insulating region 160b may be disposed. The first insulating region 160a may be disposed to be close to the light amplification electrode LAE, and the second insulating region 160b may be disposed to be close to the light modulation electrode LME. The light amplification waveguide may be electrically insulated from the light modulation waveguide by the insulating regions 160a and 160b. The insulating regions 160a and 160b may be formed by injecting oxygen ions into at least the third cladding pattern 150.

Next, the first mode convertor in the first mode converting region 10 will be described with reference to FIGS. 6 and 7 in more detail.

Figure 6:
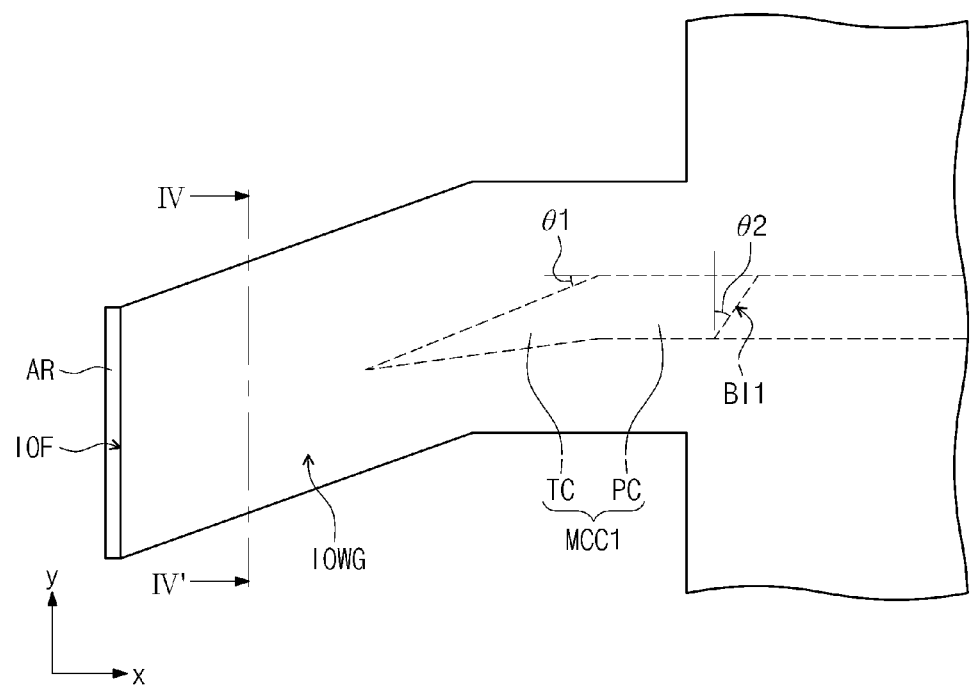
FIG. 6 is an enlarged plan view illustrating a first mode convertor of the semiconductor optical device of FIG. 2.
Figure 7:
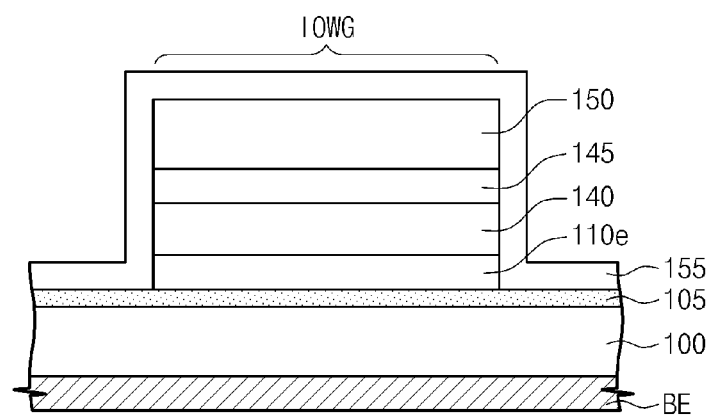
FIG. 7 is a cross-sectional view taken along a line IV-IV' of FIG. 6.

FIG. 6 is an enlarged plan view illustrating a first mode convertor of the semiconductor optical device of FIG. 2, and FIG. 7 is a cross-sectional view taken along a line IV-IV' of FIG. 6.

Referring to FIGS. 1, 2, 3, 6 and 7, the first mode convertor may include the input/output waveguide IOWG and a first mode converting waveguide which are connected to each other. The first mode converting waveguide may include the first mode converting core MCC1 and the base, first, second, and third cladding patterns 110p, 140, 145, and 150 surrounding the first mode converting core MCC1. The first mode converting waveguide may be disposed between the input/output waveguide IOWG and the light amplification core LAC.

As illustrated in FIGS. 6 and 7, the input/output waveguide IOWG may include the extension 110e of the base cladding pattern 110p, the first cladding pattern 140, the second first cladding pattern 145, and the third cladding pattern 150 which are sequentially stacked on the semiconductor substrate 110 at a side of the first mode converting waveguide. Additionally, the input/output waveguide IOWG may further include the sub-core 105 under the extension 110e of the base cladding pattern 110p thereof. The input/output waveguide IOWG has an input/output facet IOF which the optical signal is inputted into/outputted from. In some embodiments, an antireflection coating film AR may be formed on the input/output facet IOF.

The first mode converting core MCC1 may include a uniform portion PC and a tapered portion TC. An end of the uniform portion PC is connected to the light amplification core LAC in the butt joint. As illustrated in FIG. 6, a width of the tapered portion TC may become progressively less toward the input/output facet IOF from another end of the uniform portion PC when viewed from a plan view. Accordingly, the tapered portion TC may have a tapered shape toward the input/output facet IOF. The uniform portion PC may have a substantially uniform width.

In some embodiments, the tapered portion TC may extend in a direction being non-parallel to and non-perpendicular to the one direction (e.g. the longitudinal direction of the light amplification core LAC) when viewed from a top plan. As illustrated in FIG. 6, a first angle 1 may be defined between the extending direction of the tapered portion TC and the one direction. The first angle 1 may be configured to reduce inner reflection of the optical signal. For example, the first angle 1 may be about 7 degrees, but it should not be limited thereto.

As illustrated in FIG. 6, the first butt interface BI1 may be non-parallel to and non-perpendicular to the one direction (e.g. the longitudinal direction of the light amplification core LAC) in a plan view. A second angle 2 may be defined between the first butt interface BI1 and a direction perpendicular to the one direction. The direction perpendicular to the one direction may correspond to a y-axis direction of FIGS. 2 and 6. For example, the second angle 2 may be about 7 degrees, but it should not be limited thereto.

In some embodiments, the second and third butt interfaces BI2 and BI3 illustrated in FIG. 2 may also be non-parallel to and non-perpendicular to the one direction. In some embodiments, an angle between the second butt interface BI2 and the direction perpendicular to the one direction may be substantially equal to the second angle 2. And an angle between the third butt interface BI3 and the direction perpendicular to the one direction may be substantially equal to the second angle 2. In other words, the first, second, and third butt interfaces BI1 BI2, and BI3 may be parallel to each other.

Next, the second mode convertor in the second mode converting region 30 will be described with reference to FIGS. 8 through 10 in more detail.

Figure 8:
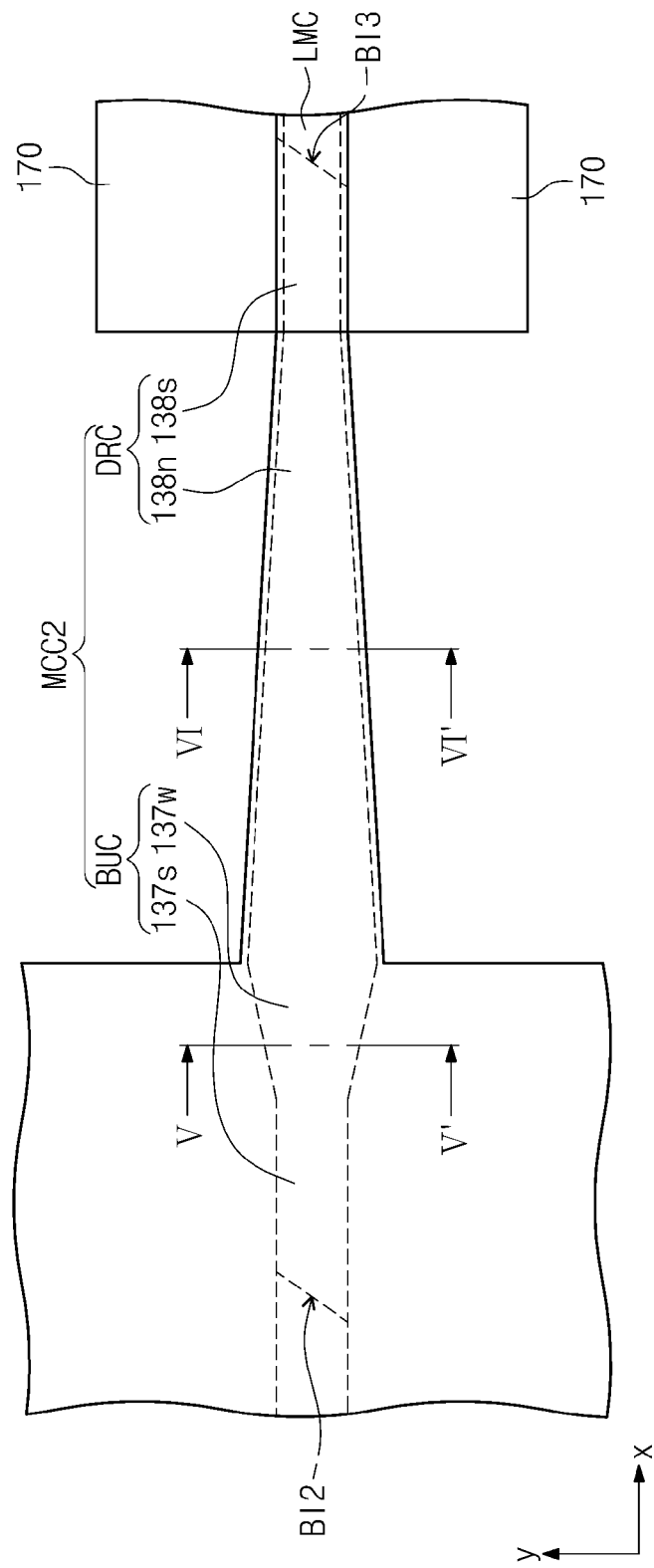
FIG. 8 is an enlarged plan view illustrating a second mode convertor of the semiconductor optical device of FIG. 2.
Figure 9:
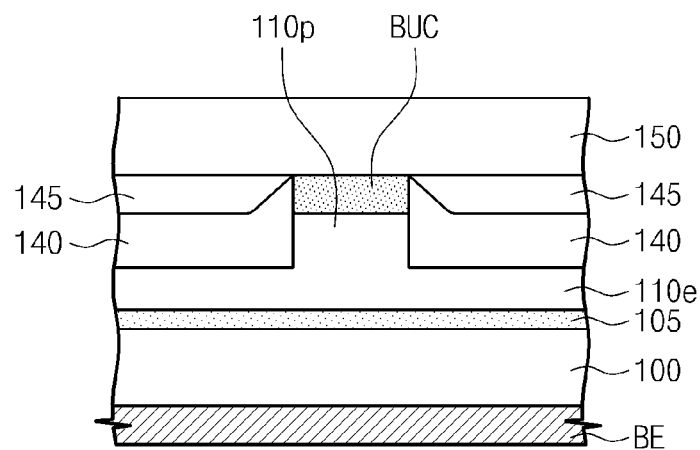
FIG. 9 is a cross-sectional view taken along a line V-V' of FIG. 8.
Figure 10:
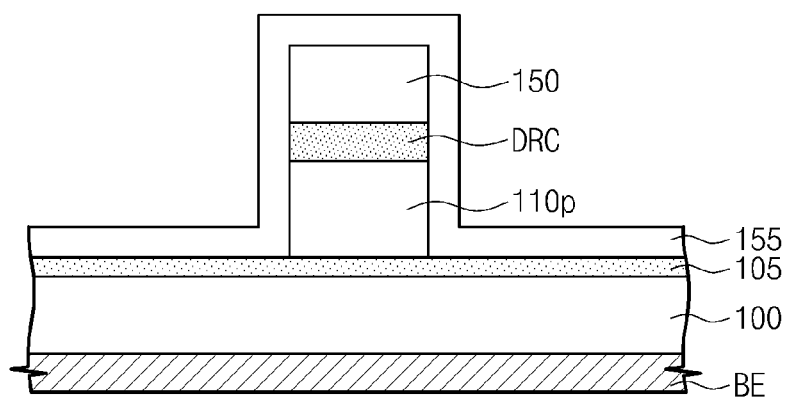
FIG. 10 is a cross-sectional view taken along a line VI-VI' of FIG. 8.

FIG. 8 is an enlarged plan view illustrating a second mode convertor of the semiconductor optical device of FIG. 2, FIG. 9 is a cross-sectional view taken along a line V-V' of FIG. 8, and FIG. 10 is a cross-sectional view taken along a line VI-VI' of FIG. 8. For the purpose of ease and convenience in explanation, the insulating regions are omitted in FIG. 8.

Referring to FIGS. 1, 2, 3, 8, 9, and 10, the second mode convertor may include a second mode converting waveguide including the second mode converting core MCC2. The second mode converting waveguide may include a first portion having a buried structure and a second portion having a deep-ridge structure. The first portion of the second mode converting waveguide may be connected to the light amplification waveguide of the light amplification region 20, and the second portion of the second mode converting waveguide may be connected to the light modulation waveguide of the light modulating region 40.

As illustrated in FIG. 8, the second mode converting core MCC2 may include a buried core portion BUC and a deep-ridge core portion DRC. As illustrated in FIGS. 2, 8, and 9, the buried core portion BUC may be surrounded by the base, first, second, and third cladding patterns 110p, 140, 145, and 150 in the second mode converting region 30. The buried core portion BUC and the cladding patterns 110p, 140, 145, and 150 surrounding it may correspond to the first portion of the second mode converting waveguide.

As illustrated in FIGS. 2, 8 and 10, a bottom surface and a top surface of the deep-ridge core portion DRC may be covered by the base cladding pattern 110p and the third cladding pattern 150 in the second mode converting region 30, respectively. Here, both sidewalls of the deep-ridge core portion DRC are not covered by the first and second cladding patterns 140 and 145. Thus, the deep-ridge core portion DRC, the base cladding pattern 110p thereunder, and the third cladding pattern 150 thereon may correspond to the second portion of the second mode converting waveguide.

As illustrated in FIGS. 2 and 8, the buried core portion BUC may include a buried straight portion 137s connected to the light amplification core LAC in the butt joint, and a buried widening portion 137w connected to the deep-ridge core portion DRC. The buried widening portion may be disposed between the buried straight portion 137s and the deep-ridge core portion DRC. The buried straight portion 137s may have a substantially uniform width. The width of the buried straight portion 137s may be substantially equal to a width of the light amplification core LAC. A width of the buried widening portion 137w may become progressively greater toward the light modulation core LMC from the light amplification LAC in a plan view.

The deep-ridge core portion DRC may include a deep-ridge narrowing portion 138n connected to the buried widening portion 137w, and a deep-ridge straight portion 138s connected to the light modulation core LMC in the butt joint. The deep-ridge narrowing portion 138n is disposed between the buried widening portion 137w and the deep-ridge straight portion 138s. A width of the deep-ridge narrowing portion 138n may become progressively less toward the light modulation core LMC from the light amplification core LAC. The deep-ridge straight portion 138s may have a substantially uniform width. The width of the deep-ridge straight portion 138s may be substantially equal to a width of the light modulation core LMC. The buried straight portion 137s, the buried widening portion 137w, the deep-ridge narrowing portion 138n, and the deep-ridge straight portion 138s may be sequentially arranged in the one direction without an interface when viewed from a plan view.

The second mode converting core MCC2 may include the buried widening portion 137w and the deep-ridge narrowing portion 138n. Thus, it is possible to minimize the loss of the optical signal which may be caused by connection of a waveguide having a buried structure and a waveguide having a deep-ridge structure.

For example, a length of the buried widening portion 137w along the one direction may be about 40 µm, and a maximum width of the buried widening portion 137w may be about 4 µm. A length of the deep-ridge narrowing portion 138n may be about 50 µm, and a width of the deep-ridge straight portion 138s may be about 2 µm. However, the inventive concept is not limited thereto.

Next, a method of operating the above semiconductor optical device will be described, hereinafter. An external beam may be incident to the input/output facet IOF. The beam may include the optical signal. The loss of the incident beam may be minimized by the antireflection coating film AR. The beam passing through the input/output waveguide IOWG may have a size of about 5 µm to about 6 µm. After the beam of about 5 µm to about 6 µm passes through the waveguide including the tapered portion TC of the first mode converting core MCC1, the beam may become small to have a size of about 1 µm. The beam may be provided into the light amplification core LAC via the uniform portion PC and the first butt interface BI1. Since the tapered portion TC is disposed to have the first angle 1, it is possible to minimize the loss of the beam caused by reflection. Additionally, since the first butt interface BI1 is disposed to have the second angle 2, it is possible to minimize reflection of the beam caused by the first butt interface BI1. However, the inventive concept is not limited to the numerical value described above.

A forward current may be provided between the light amplification electrode LAE and the back side electrode BE. Thus, the optical signal in the beam is amplified in the light amplification core LAC. Here, as described above, the light amplification core LAC is surrounded by the current blocking section including the first, second, and third cladding patterns 140, 145, and 150. Since the current blocking section has the PNP structure, the loss of the forward current can be minimized to increase light amplification efficiency.

The beam including the amplified optical signal passes through the second mode convertor. As described above, the second mode converting core MCC2 includes the buried widening portion 137w and the deep-ridge narrowing portion 138n. Thus, even though the second mode convertor includes the waveguide of the buried structure and the waveguide of the deep-ridge structure, the loss of the optical signal passing through the second mode convertor can be minimized Additionally, since the second butt interface BI2 is non-parallel to and non-perpendicular to the one direction, it is possible to minimize the reflection of the beam caused by the second butt interface BI2.

After the beam passes through the second mode convertor, the beam is provided into the light modulation core LMC through the third butt interface BI3. The third butt interface BI3 may also be non-parallel to and non-perpendicular to the one direction, so that the reflection of the beam caused by the third butt interface BI3 can be minimized A reverse bias may be provided to the light modulation waveguide through the light modulation electrode LME and the back side electrode BE. Thus, as described above, the optical signal provided in the light modulator can be modulated.

The beam including the modulated optical signal may be reflected by the high reflection coating film HR to be transmitted into the first mode converting core MCC1 via the light modulation core LMC, the second mode converting core MCC2 and the light amplification core LAC. The beam transmitted into the first mode converting core MCC1 may pass through the uniform portion PC and the tapered portion TC to transition into the sub-waveguide including the sub-core 105. The beam transitioning in the sub-waveguide may stably proceed through the input/output waveguide IOWG to be outputted through the input/output facet IOF. The input/output facet IOF may be connected to an optical fiber. The outputted beam may be transmitted into the optical fiber.

The semiconductor optical device described above may include the cores MCC1, LAC and LMC which include materials different from each other. In other words, the semiconductor optical device includes the mode convertors, the light amplifier, and the light modulator performing functions different from each other. Thus, the semiconductor optical device with high integration and multi-function may be realized. Additionally, the light amplification LAC of the light amplifier is covered by the current blocking section including the first, second, and third cladding patterns 140, 145, and 150. Thus, the current blocking section may be realized to have the PNP structure. As a result, the loss of the forward current between the light amplification electrode LAE and the back side electrode BE for the light amplification can be minimized to improve the light amplification efficiency. Furthermore, since the cores MCC1, LAC, MCC2, and LMC may be connected to each other in the butt joints, characteristic of the first mode convertor, second mode convertor and the light modulator may be improved. As a result, it is possible to realize the semiconductor optical device having various functions of excellent characteristics.

Meanwhile, the above insulating regions 160a and 160b may be formed by injecting oxygen ions. Alternatively, the insulating regions 160a and 160b may have a different form. This will be described with reference to FIG. 11.

Figure 11:
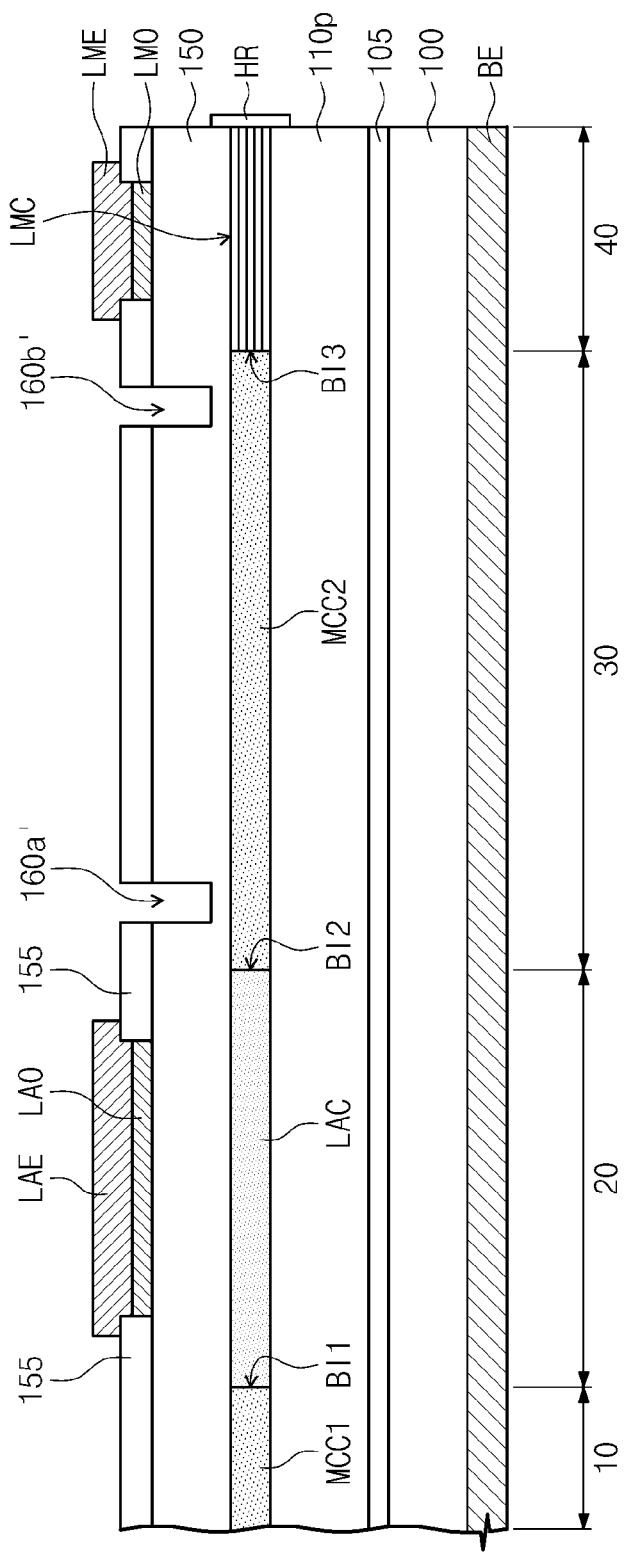
FIG. 11 is a cross-sectional view taken along a line I-I' of FIG. 2 to explain a modified example of a semiconductor optical device according to an exemplary embodiment of the inventive concept.
Figure 12A:
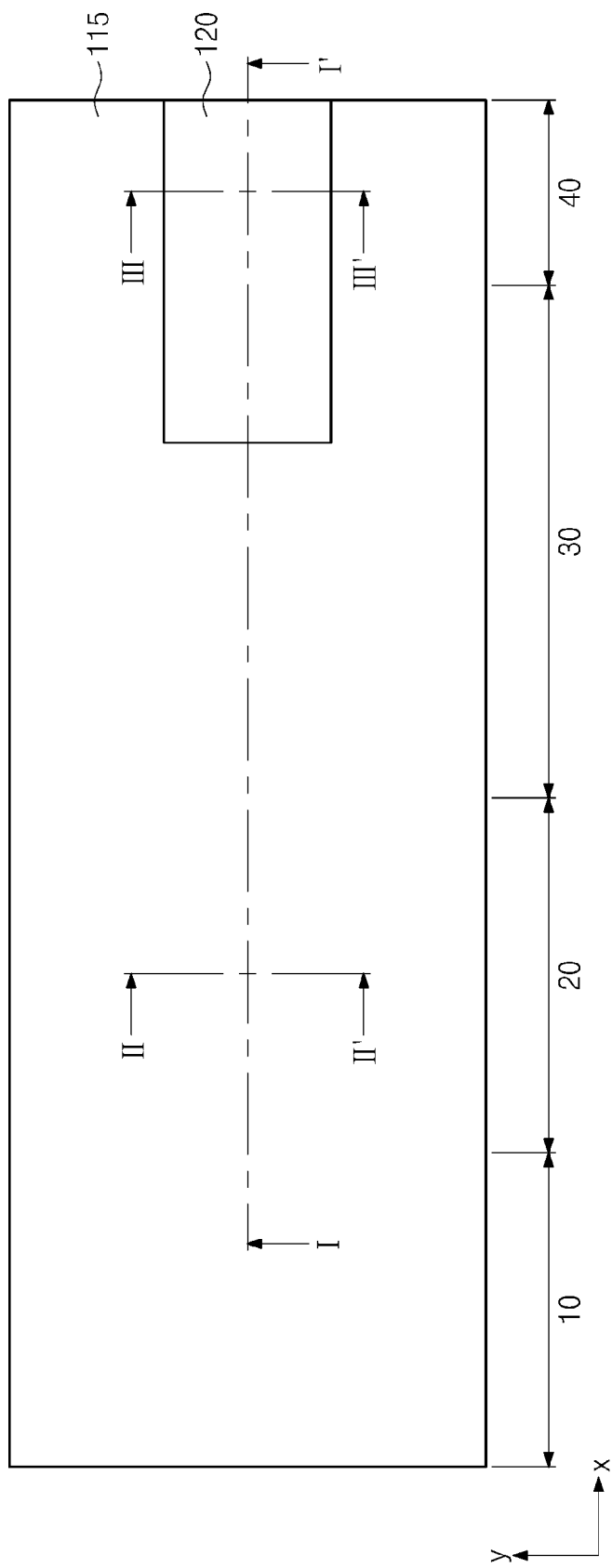
Figure 12B:
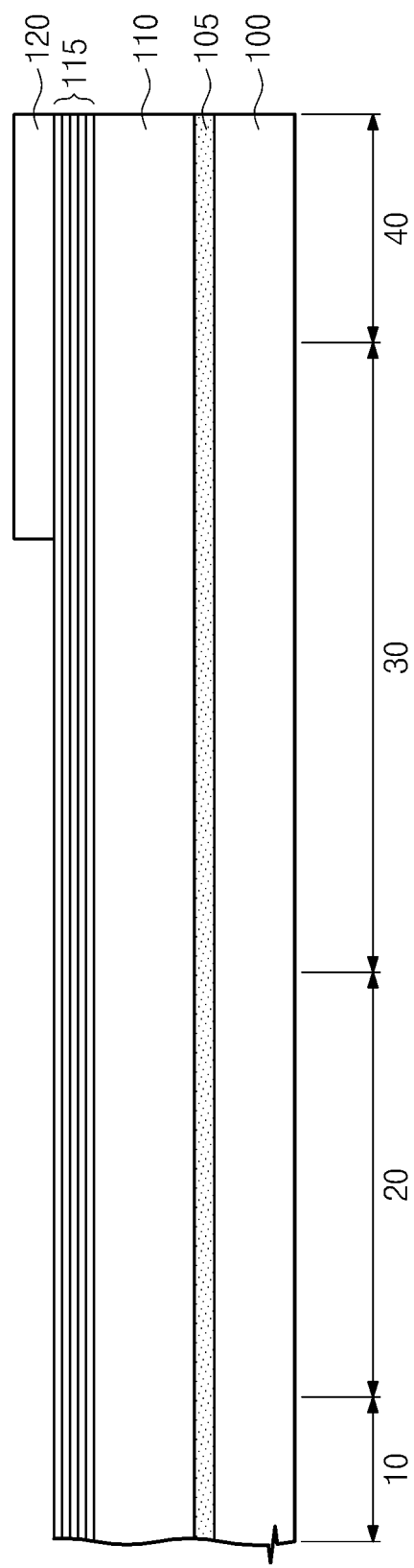
Figure 12C:
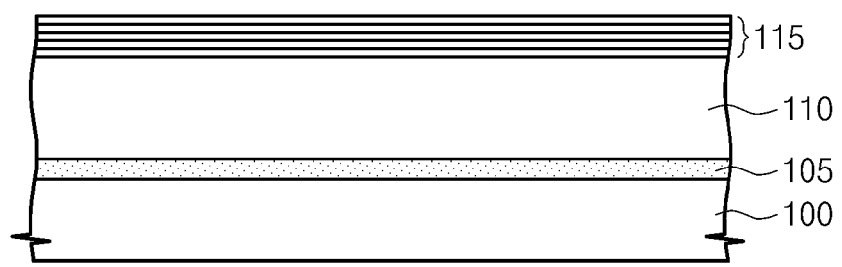
Figure 12D:
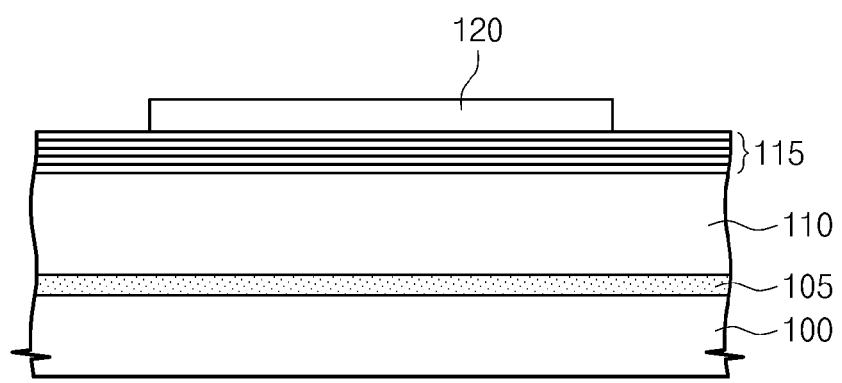

FIG. 11 is a cross-sectional view taken along a line I-I' of FIG. 2 to explain a modified example of a semiconductor optical device according to an exemplary embodiment of the inventive concept.

Referring to FIG. 11, at least one insulating region 160a' and 160b' may be disposed in at least the third cladding pattern 150 between the light amplification electrode LAE and the light modulation electrode LME. In some embodiments, a first insulating region 160a' and a second insulating region 160b' may be disposed between the light amplification electrode LAE and the light modulation electrode LME. Each of the first and second insulating regions 160a' and 160b' may have a trench shape formed in the third cladding pattern 150. The first and second insulating regions 160a' and 160b' of the trench shape may be filled with an air.

Hereinafter, a method of fabricating a semiconductor optical device according to an exemplary embodiment of the inventive concept will be described with reference to drawings.

FIGS. 12A through 16A are plan views illustrating a method of fabricating a semiconductor optical device according to an exemplary embodiment of the inventive concept. FIGS. 12B through 16B are cross-sectional views taken along lines I-I' of FIGS. 12A through 16A, respectively. FIGS. 12C through 16C are cross-sectional views taken along lines II-II' of FIGS. 12A through 16A, respectively. FIGS. 12D through 16D are cross-sectional views taken along lines III-III' of FIGS. 12A through 16A, respectively.

Referring to FIGS. 12A, 12B, 12C, and 12D, a semiconductor substrate 100 is prepared. The semiconductor substrate 100 includes a first mode converting region 10, a light amplification region 20, a second mode converting region 30, and a light modulating region 40. A sub-core 105 is formed on the semiconductor substrate 100. The sub-core 105 may be formed on an entire surface of the semiconductor substrate 100. A base cladding layer 110 may be formed on an entire surface of the sub-core 105. A light modulation layer 115 may be formed on the base cladding layer 110. The light modulation core layer 115 may also be formed over the entire surface of the semiconductor substrate 100. As described above, the sub-core 105 may be formed of the four-elements-compound semiconductor having the first energy band gap. The light modulation core layer 115 may have the multiple quantum well structure.

A mask pattern 120 may be formed on the light modulation core layer 115. The mask pattern 120 may be formed of silicon nitride. The mask pattern 120 may be disposed on the light modulation core layer 115 in the light modulating region 40. Additionally, the mask pattern 120 may laterally extend into the second mode converting region 30. At this time, at least the light modulation core layer 115 in the light amplification region 20 may be exposed. Additionally, the light modulation core layer 115 in the first mode converting region 10 may be exposed. Furthermore, a portion of the light modulation core layer 115 in the second mode converting region 30 may be exposed.

Referring to FIGS. 13A, 13B, 13C, and 13D, the exposed light modulation core layer 115 is removed. Thus, a first removed region may be formed. Additionally, a first residual pattern 115a may be formed under the mask pattern 120. The first residual pattern 115a corresponds to a portion of the light modulation core layer 115 which is covered by the mask pattern 120. A first semiconductor layer 125 may be grown in the first removed region. The first semiconductor layer 125 may be formed of the compound semiconductor of the light amplification core LAC in FIG. 2. In other words, the first semiconductor layer 125 may be formed of the four-elements-compound semiconductor having the second energy band gap.

The mask pattern 120 may be removed. In some embodiments, the mask pattern 120 may be removed after the first semiconductor layer 125 is formed.

A first hard mask pattern 130a and a second hard mask pattern 130b may be formed over the semiconductor substrate 100. The first hard mask pattern 130a may be formed on the semiconductor layer 125 in the light amplification region 20. The second hard mask pattern 130b may be formed on a portion of the first residual pattern 115a in the light modulating region 40. A length of the first hard mask pattern 130a in one direction may be substantially equal to the length of the light amplification core LAC described with reference to FIGS. 1 through 5. The one direction ma correspond to an x-axis direction of FIG. 13A. a planar area of the second hard mask pattern 130b may be less than that of the first residual pattern 115a. Thus, a portion of the first residual pattern 115a around the second hard mask pattern 130b may be exposed. At this time, a portion of the first residual pattern 115a, which is located in the second mode converting region 30, may also be exposed. The first hard mask pattern 130a is laterally separated from the second hard mask pattern 130b.

Figure 13A:
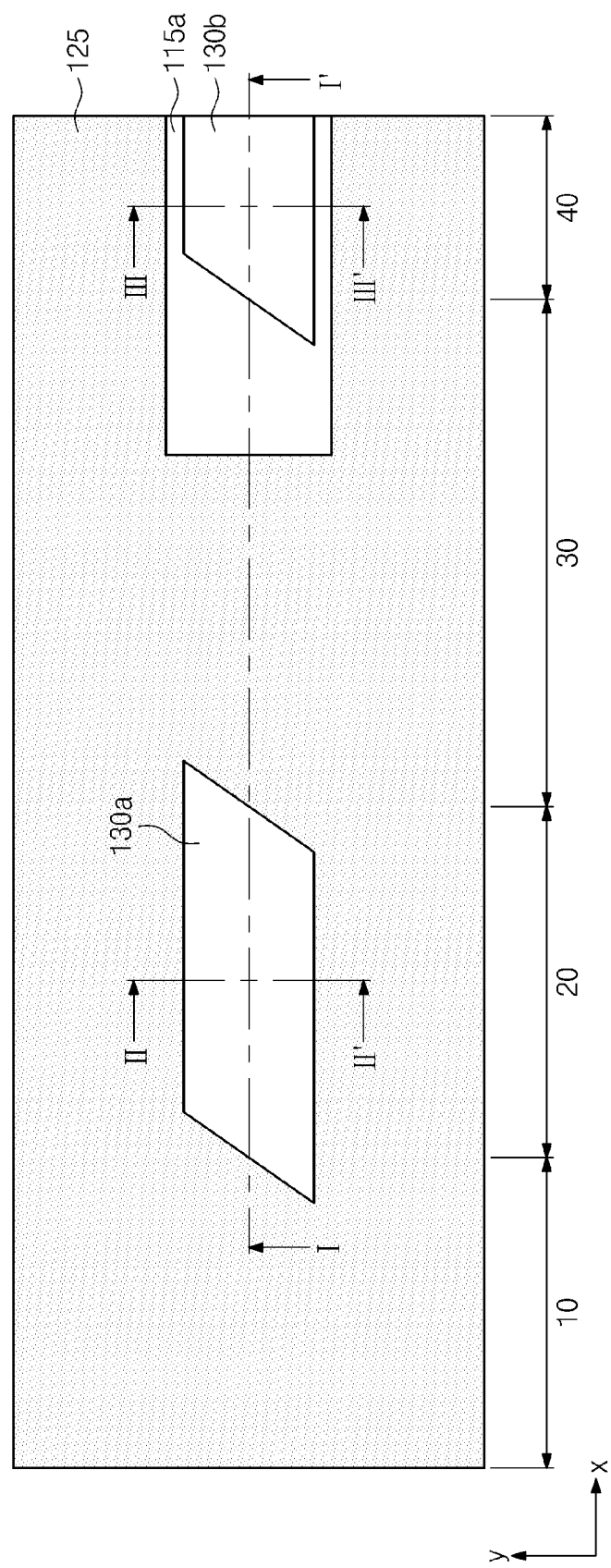
Figure 13C:
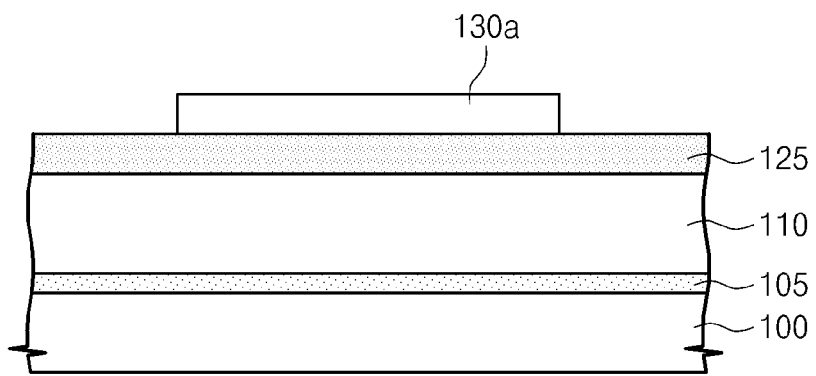
Figure 13D:
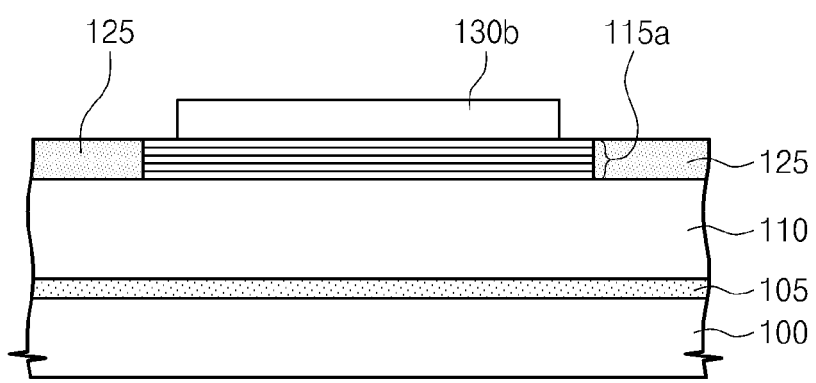
Figure 14A:
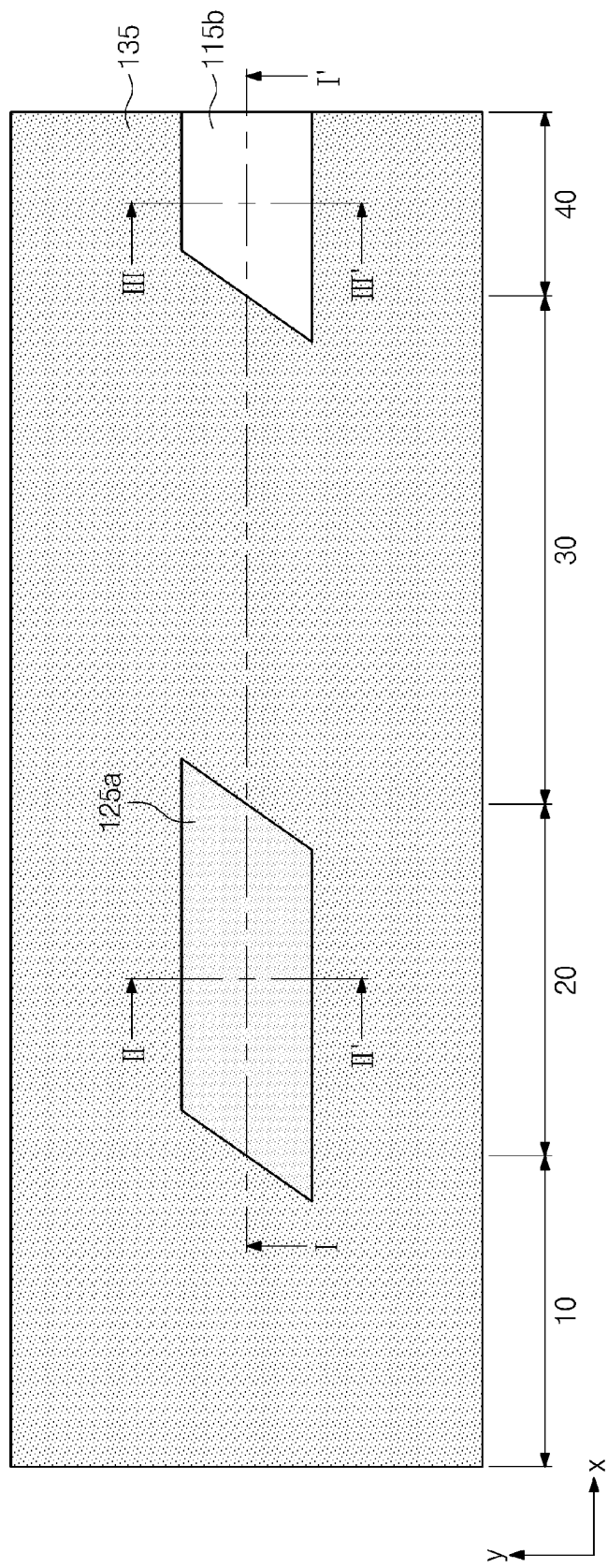
Figure 14B:
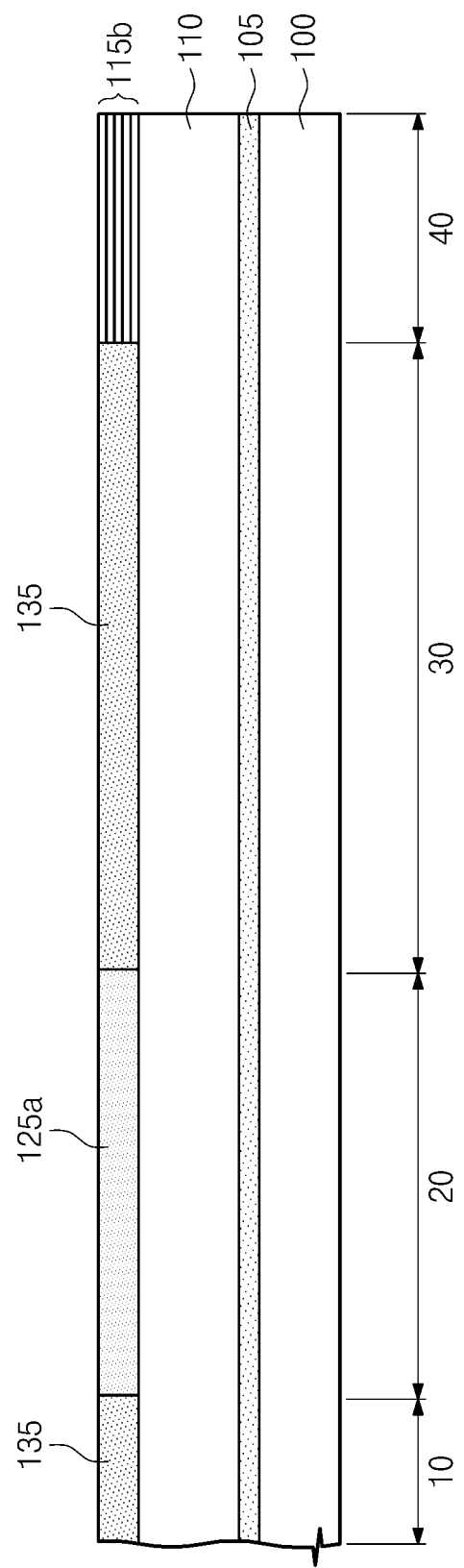
Figure 14C:
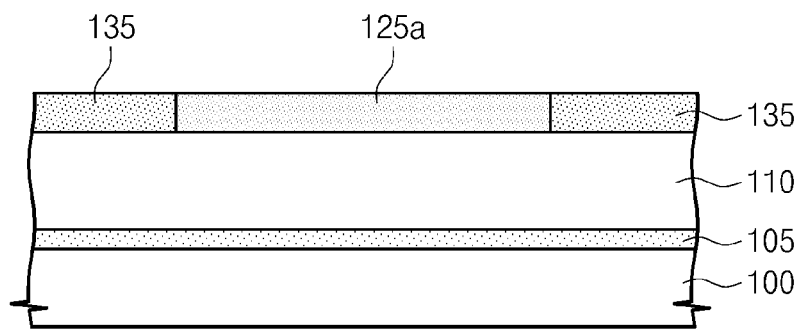
Figure 14D:
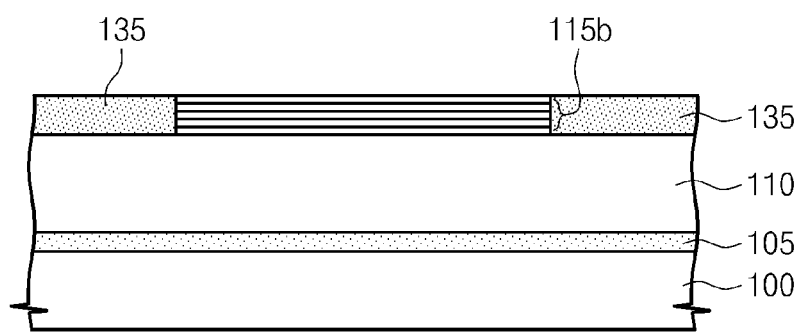
Figure 15A:
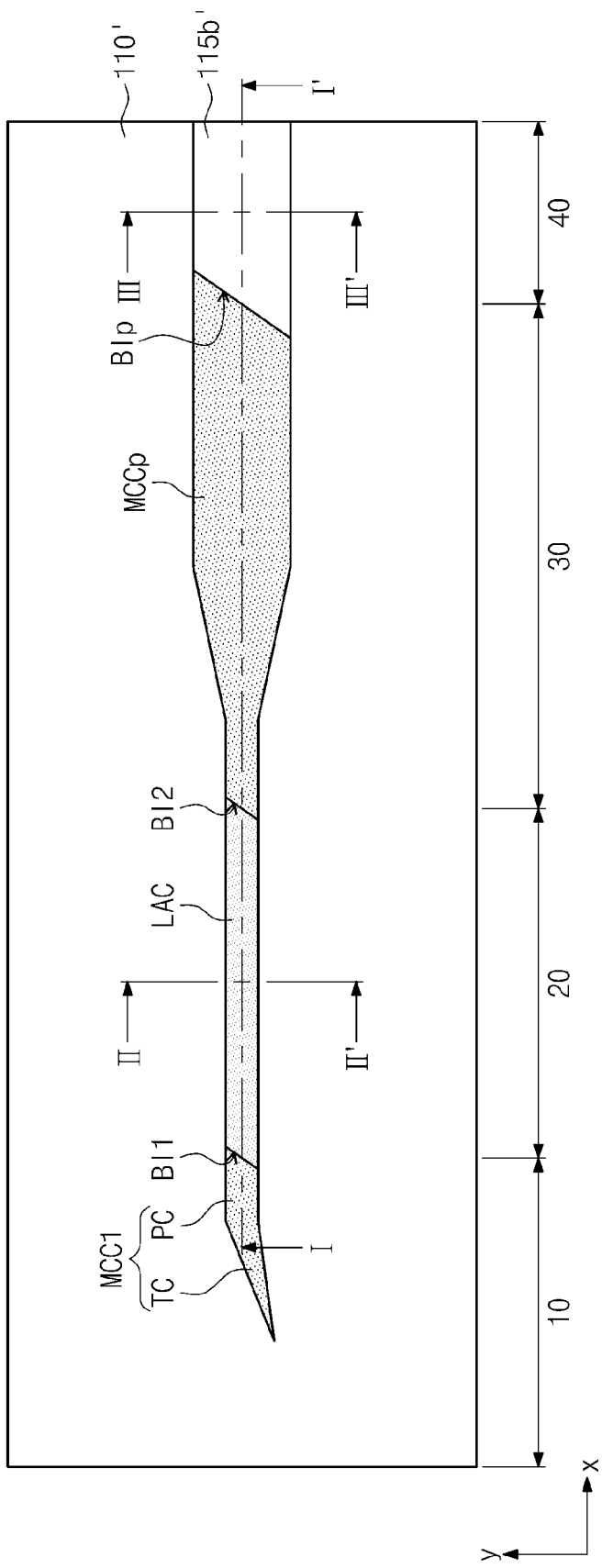
Figure 15B:
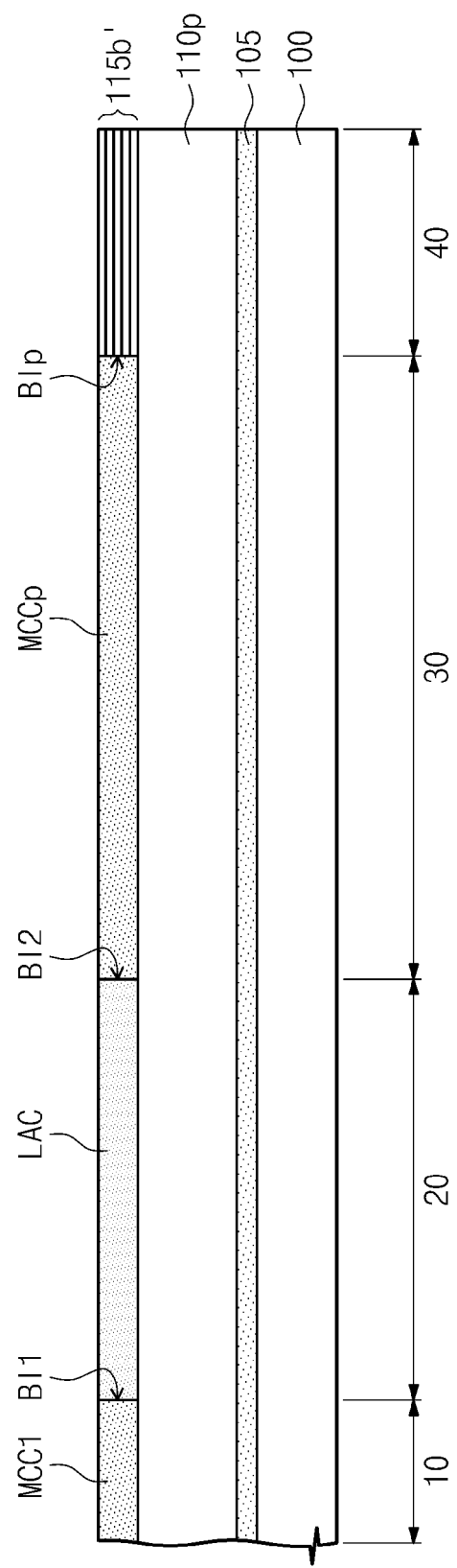
Figure 15C:
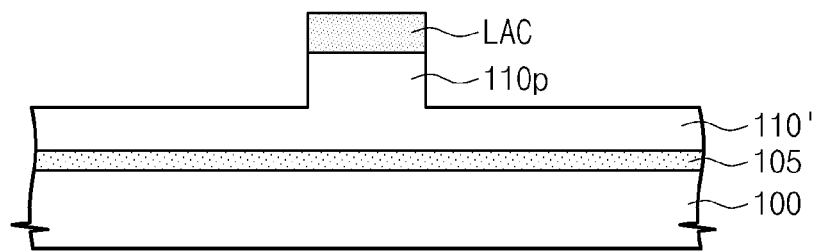
Figure 15D:
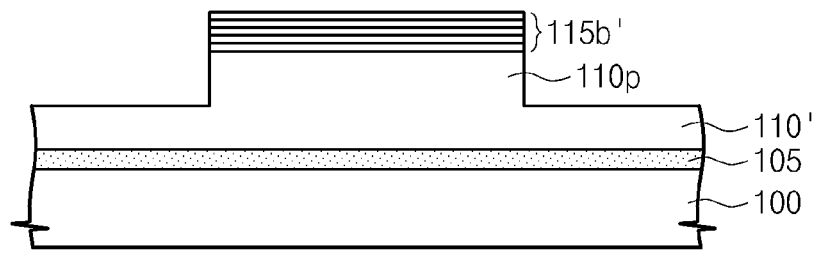
Figure 16A:
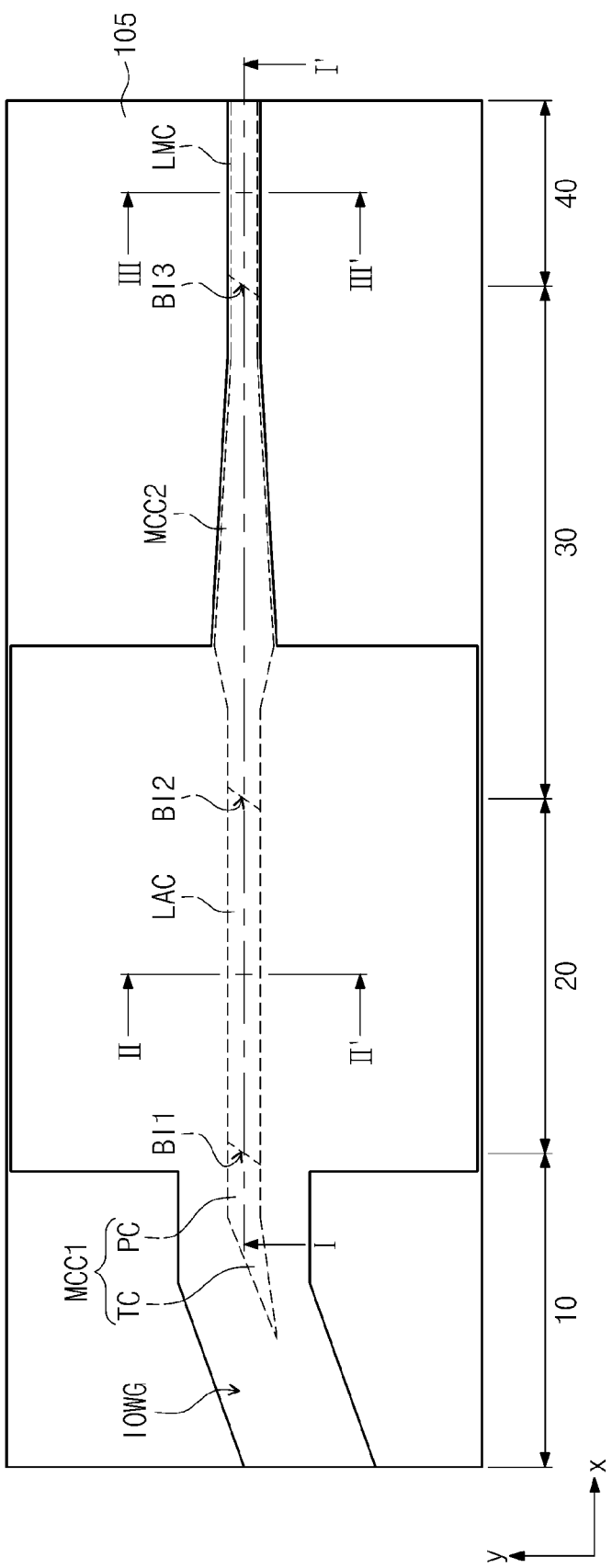
Figure 16C:
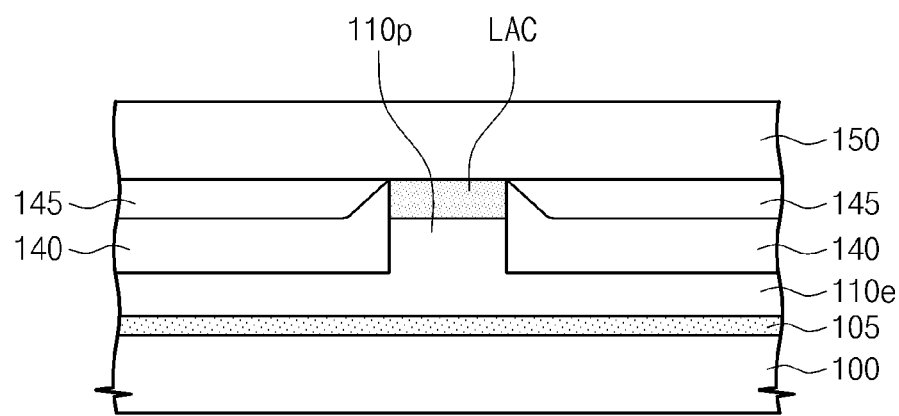
Figure 16D:
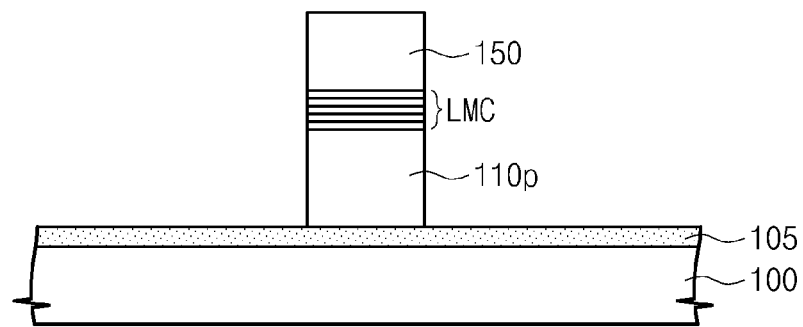

As illustrated in FIG. 13A, the first hard mask pattern 130a may include a pair of sidewalls being non-parallel to and non-perpendicular to the one direction when viewed from a plan view. The pair of sidewalls of the first hard mask pattern 130a may be parallel to each other. Portions of the pair of sidewalls of the first hard mask pattern 130a may define the first and second butt interfaces BI1 and BI2 of FIG. 2, respectively. The second hard mask pattern 130b may include one sidewall being non-parallel to and non-perpendicular to the one direction when viewed from a plan view. In some embodiments, the one sidewall of the second hard mask pattern 130b may be parallel to the pair of sidewalls of the first hard mask pattern 130a. A portion of the one sidewall of the second hard mask pattern 130b may define the third butt interface BI3 of FIG. 2. The first and second hard mask patterns 130a and 130b may be formed of silicon nitride.

Referring to FIGS. 14A, 14B, 14C, and 14D, the exposed first semiconductor layer 125 and the exposed first residual pattern 115a may be removed using the first and second hard mask patterns 130a and 130b as etch masks. Thus, a second removed region is formed. Additionally, a first semiconductor pattern 125a is formed under the first hard mask pattern 130a, and a second residual pattern 115b is formed under the second hard mask pattern 130b. The second residual pattern 115b corresponds to a portion of the first residual pattern 115a which is covered by the second hard mask pattern 130b.

A first semiconductor pattern 125a has a pair of sidewalls which are aligned with the pair of sidewalls of the first hard mask pattern 130a, respectively. Additionally, the second residual pattern 115b has one sidewall aligned with the one sidewall of the second hard mask pattern 130b. The pair of sidewalls of the first semiconductor pattern 125a and the one sidewall of the second residual pattern 115b may be non-parallel to and non-perpendicular to the one direction in a plan view.

A second semiconductor layer 135 may be grown in the second removed region. The second semiconductor layer 135 is in contact with the pair of sidewalls of the first semiconductor pattern 125a and the one sidewall of the second residual pattern 115b. The second semiconductor layer 135 may be formed of the compound semiconductor of the first and second mode converting cores MCC1 and MCC2 illustrated in FIG. 2. In other words, the second semiconductor layer 135 may be formed of the four-elements-compound semiconductor having the third energy band gap.

The first and second hard mask patterns 130a and 130b may be removed. The first and second hard mask patterns 130a and 130b may be removed after the second semiconductor layer 135 is formed.

Referring to FIGS. 15A, 15B, 15C, and 15D, subsequently, a core mask pattern (not shown) may be formed over the semiconductor substrate 100. The core mask pattern may be disposed in the first mode converting region 10, the light amplification region 20, the second mode converting region 30, and the light modulating region 40. The first semiconductor pattern 125a, the second semiconductor layer 135, and the base cladding layer 110 may be etched using the core mask pattern as an etch mask. Thus, a first mode converting core MCC1, a light amplification core LAC, and preliminary second mode converting core MCCp may be formed. At this time, a portion of the second residual pattern 115b may also be etched. Accordingly, the etched second residual pattern 115b' may have a sidewall aligned with a sidewall of the preliminary second mode converting core MCCp which is parallel to the one direction.

The second semiconductor layer 135 in the first mode converting region 10 may be etched to form the first mode converting core MCC1. The first semiconductor pattern 125a in the light amplification region 20 may be etched to form the light amplification core LAC. The second semiconductor layer 135 in the second mode converting region 30 may be etched to form the preliminary second mode converting core MCCp. The preliminary second mode converting core MCCp may include the buried core portion BUC illustrated in FIG. 8. Accordingly, first and second butt interfaces BI1 and BI2 may be defined. A preliminary third butt interface BIp may be defined between the preliminary second mode converting core MCCp and the etched second residual pattern 115b'.

A base cladding pattern 110p may be defined under the cores MCC1, LAC, and MCCp and the etched second residual pattern 115b'. The base cladding pattern 110p may have sidewalls aligned with the sidewalls of the cores MCC1, LAC, and MCCp and the etched second residual pattern 115b'. An etched base cladding layer 110' may remain beside the base cladding pattern 110p. A top surface of the etched base cladding layer 110' may be located at a lower level than a top surface of the base cladding pattern 110p.

Referring to FIGS. 16A, 16B, 16C, and 16D, subsequently, a first cladding layer and a second cladding layer may be sequentially formed on the semiconductor substrate 100. The second and first cladding layers may be planarized until the cores MCC1, LAC, and MCCp and the etched second residual pattern 115b' are exposed. Subsequently, a third cladding layer may be formed on the semiconductor substrate 100. The third cladding layer, the planarized second and first cladding layers, the preliminary second mode converting core MCCp, the etched second residual pattern 115b', and the etched base cladding layer 110' may be successively patterned to form first, second, and third cladding patterns 140, 145, and 150, a second mode converting core MCC2 and a light modulation core LMC. As a result, an input/output waveguide IOWG, a first mode converting waveguide, a light amplification waveguide, a second mode converting waveguide, and a light modulation waveguide may be formed. The base cladding layer 110' beside the waveguides may be removed to expose the sub-core 105. At this time, an extension 110e of the base cladding pattern 110p may remain under the first cladding pattern 140. The second mode converting core MCC2 corresponds to a portion of the preliminary second mode converting core MCCp, and the light modulation core LMC corresponds to a portion of the etched second residual pattern 115b'. A third butt interface BI3 is defined by the formation of the second mode converting core MCC2 and the light modulation core LMC.

Subsequently, the polyimide pattern 170, the ohmic patterns LAO and LMO, the electrodes LAE, LME, and BE, and the insulating regions 160a and 160b illustrated in FIGS. 1, 2 and 3 may be formed. After the cladding layers are patterned, the capping dielectric pattern 155 and/or the ohmic patterns LAO and LMO may be formed. The insulating regions 160a and 160b may be replaced with insulating regions 160a' and 160b' illustrated in FIG. 11.

According to the above method of fabricating the semiconductor optical device, the first semiconductor layer 125 may be formed after the first removed region is formed, and the second semiconductor layer 135 may be formed after the second removed region is formed. Thus, the semiconductor layers 125 and 135 and the second residual pattern 115b, which have different characteristics from each other, can be selectively formed in the first mode converting, the light amplification, the second mode converting, and the light modulating regions 10, 20, 30, and 40. Additionally, the semiconductor layers 125 and 135 and the second residual pattern 115b may be formed to be in contact with each other laterally. Subsequently, after the first and second semiconductor layers 125 and 135 may be patterned to form cores of buried waveguides, the cladding layers may be formed. The cladding layers, a portion of the second semiconductor layer and the second residual pattern may be patterned to waveguides of the deep-ridge structure. As a result, the waveguides, which perform different functions from each other and have different forms from each other, can be easily formed. Additionally, since the first and second semiconductor layers 125 and 135 and the second residual pattern 115b are in contact with each other, the cores MCC1, LAC, MCC2, and LMC can be connected to each other the butt joints. Thus, the first mode converting waveguide, the light amplification waveguide, the second mode converting waveguide, and the light modulation waveguide may be stably combined into each other. In other words, the loss of the optical signal caused by the combination of the waveguides may be minimized.

the semiconductor optical device described above may include the first mode converting, the light amplification, the second mode converting, and the light modulation cores different from each other. Thus, the semiconductor optical device may include components performing different functions from each other. As a result, the semiconductor optical device can perform various functions.

Additionally, the cores are butt-joined to each other. The sidewalls of the top surface of the light amplification core are covered by the current blocking section, and the current blocking section includes the first, second, and third cladding patterns sequentially stacked. At this time, the second cladding pattern is doped with dopants of the first conductivity type, and the first and third cladding patterns are doped with dopants of the second conductivity type. Thus, the current blocking section has the PNP structure. Accordingly, it is possible to minimize the loss of the forward current for light amplification due to the current blocking section. As a result, the components respectively including the cores can have excellent characteristics.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor optical device comprising:
a first mode converting core, a light amplification core, a second mode converting core, and a light modulation core disposed in a first mode converting region, a light amplification region, a second mode converting region, and a light modulating region of a semiconductor substrate, respectively; and
a current blocking section covering at least sidewalls and a top surface of the light amplification core,
wherein the first mode converting core, the light amplification core, the second mode converting core, and the light modulation core are arranged along one direction in the order named, and are connected to each other in butt joints; and
wherein the current blocking section includes first, second, and third cladding patterns sequentially stacked, the second cladding pattern is doped with dopants of a first conductivity type, and the first and third cladding patterns are doped with dopants of a second conductivity type.

2. The semiconductor optical device of claim 1, wherein the dopants of the first conductivity type are N-type dopants and the dopants of the second conductivity type are P-type dopants.

3. The semiconductor optical device of claim 1, wherein the first cladding pattern and the second cladding pattern cover the sidewalls of the light amplification core, and the third cladding pattern covers the second cladding pattern and the top surface of the light amplification core.

4. The semiconductor optical device of claim 1, further comprising:
a sub-core disposed on the semiconductor substrate; and
a base cladding pattern disposed on the sub-core,
wherein the first mode converting core, the light amplification core, the second mode converting core, and the light modulation core are disposed on the base cladding pattern.

5. The semiconductor optical device of claim 1, wherein the first, second, and third cladding patterns extend into the first mode converting region to cover sidewalls of a top surface of the first mode converting core; and
wherein the first, second, and third cladding patterns further extend to pass an end of the first mode converting core, thereby forming an input/output waveguide.

6. The semiconductor optical device of claim 1, wherein the first mode converting core includes a tapered portion and a uniform portion;
wherein the uniform portion is connected to the light amplification in the butt joint; and
wherein the uniform portion is disposed between the tapered portion and the light amplification core.

7. The semiconductor optical device of claim 6, wherein the tapered portion extends in a direction being non-parallel to and non-perpendicular to the one direction when viewed from a plan view.

8. The semiconductor optical device of claim 1, wherein the first mode converting core, the light amplification core, and the second mode converting core are formed of semiconductor materials different from the semiconductor substrate.

9. The semiconductor optical device of claim 1, wherein the light amplification core is formed of a first semiconductor material and the first and second mode converting cores are formed of a second semiconductor material;
wherein an energy band gap of the first semiconductor material is different form an energy band gap of the second semiconductor material; and
wherein the light modulation core is formed of a different material from the first and second semiconductor materials.

10. The semiconductor optical device of claim 1, wherein the third cladding pattern extends into the second mode converting region and the light modulating region to cover a top surface of the second mode converting core and a top surface of the light modulation core; and
wherein the first and second cladding patterns extend into the second mode converting region to cover portions of sidewalls of the second mode converting core.

11. The semiconductor optical device of claim 10, wherein the second mode converting core includes a buried core portion and a deep-ridge core portion;
wherein the buried core portion includes a buried straight portion connected to the light amplification core in the butt joint, and a buried widening portion disposed between the buried straight portion and the deep-ridge core portion;
wherein the deep-ridge core portion includes a deep-ridge straight portion connected to the light modulation core in the butt joint, and a deep-ridge narrowing portion disposed between the deep-ridge straight portion and the buried widening portion;
wherein a width of the buried widening portion becomes progressively greater toward the light modulation core from the light amplification core; and
wherein a width of the deep-ridge narrowing portion becomes progressively less toward the light modulation core form the light amplification core.

12. The semiconductor optical device of claim 10, further comprising:
at least one insulating region formed in at least the third cladding pattern,
wherein the insulating region electrically insulates a light amplifier including the light amplification core from a light modulator including the light modulation core.

13. The semiconductor optical device of claim 1, wherein the first mod converting core is connected to the light amplification core in the butt joint to define a first butt interface, the light amplification core is connected to the second mode converting core in the butt joint to define a second butt interface, and the second mode converting core is connected to the light modulation core in the butt joint to define a third butt interface; and
wherein the first, second, and third butt interfaces are non-parallel to and non-perpendicular to the one direction when viewed from a plan view.

14. The semiconductor optical device of claim 1, further comprising:

a polyimide pattern disposed in the light modulating region and protecting a light modulator including the light modulation core.

15. The semiconductor optical device of claim 1, further comprising:
- a back side electrode formed on a back side of the semiconductor substrate;
- a light amplification electrode disposed over the light amplification core; and
- a light modulation electrode disposed over the light modulation core.

16. A method of fabricating a semiconductor optical device, comprising:
- forming a light modulation core layer on a semiconductor substrate including a first mode converting region, a light amplification region, a second mode converting region, and a light modulating region;
- selectively removing the light modulation core layer to form a first removed region and a first residual pattern, the first residual pattern formed in a portion of the light modulating region and a portion of the second mode converting region;
- forming a first semiconductor layer in the first removed region;
- selectively removing the first semiconductor layer and the first residual pattern to form a second removed region, a first semiconductor pattern in the light amplification region, and a second residual pattern in the light modulating region;
- forming a second semiconductor layer in the second removed region, the second semiconductor layer being in contact with sidewalls of the first semiconductor pattern and sidewalls of the second residual pattern; and
- patterning at least the second semiconductor layer in the first mode converting region and the first semiconductor pattern in the light amplification region to form a first mode converting core and a light amplification core,
- wherein an energy band gap of the first semiconductor layer is different from an energy band gap of the second semiconductor layer.

17. The method of claim 16, further comprising:
patterning the second semiconductor layer in the second mode converting region to form a preliminary second mode converting core,
wherein the preliminary second mode converting core, the first mode converting core, and the light amplification core are formed simultaneously.

18. The method of claim 17, further comprising:
sequentially forming a first cladding layer and a second cladding layer on the semiconductor substrate including the first mode converting core, the light amplification core, and the preliminary second mode converting core;
planarizing the second and first cladding layers to expose the first mode converting core, the light amplification core, and the preliminary second mode converting core;
forming a third cladding layer on the semiconductor substrate; and
patterning the third cladding layer, the planarized second and first cladding layers, the preliminary second mode converting core, and the second residual pattern in the light modulating region to form a first mode convertor, a light amplification waveguide, a second mode convertor, and a light modulation waveguide in the first mode converting region, the light amplification region, the second mode converting region, and the light modulating region, respectively.

19. The method of claim 16, further comprising:
sequentially forming a sub-core layer and a base cladding layer on the semiconductor layer before forming the light modulation core layer.

* * * * *